US012100340B2

(12) United States Patent
Choi et al.

(10) Patent No.: US 12,100,340 B2
(45) Date of Patent: Sep. 24, 2024

(54) DISPLAY APPARATUS AND METHOD OF MANUFACTURING THE SAME

(71) Applicant: SAMSUNG ELECTRONICS CO., LTD., Suwon-si (KR)

(72) Inventors: Junhee Choi, Seongnam-si (KR); Kiho Kong, Suwon-si (KR); Nakhyun Kim, Yongin-si (KR); Junghun Park, Yongin-si (KR); Jinjoo Park, Yongin-si (KR); Joohun Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/233,148

(22) Filed: Aug. 11, 2023

(65) Prior Publication Data

US 2023/0395016 A1 Dec. 7, 2023

Related U.S. Application Data

(60) Division of application No. 17/725,935, filed on Apr. 21, 2022, now Pat. No. 11,837,155, which is a
(Continued)

(30) Foreign Application Priority Data

Dec. 11, 2019 (KR) ........................ 10-2019-0164792

(51) Int. Cl.
*G09G 3/32* (2016.01)
*H01L 27/15* (2006.01)
(Continued)

(52) U.S. Cl.
CPC ............. *G09G 3/32* (2013.01); *H01L 27/156* (2013.01); *H01L 33/10* (2013.01); *H01L 33/346* (2013.01); *G09G 2300/0452* (2013.01)

(58) Field of Classification Search
CPC .............. G09G 3/32; G09G 2300/0452; H01L 27/156; H01L 33/10; H01L 33/346;
(Continued)

(56) References Cited

U.S. PATENT DOCUMENTS 6,905,900 B1 6/2005 Johnson et al.
8,642,363 B2 2/2014 Lau et al.
(Continued)

FOREIGN PATENT DOCUMENTS

CN 109148505 A 1/2019
WO 2019/134500 A1 7/2019

OTHER PUBLICATIONS

Communication dated May 10, 2021, issued by the European Patent Office in counterpart European Application No. 20210067.3.
(Continued)

*Primary Examiner* — S M Sohel Imtiaz
(74) *Attorney, Agent, or Firm* — Sughrue Mion, PLLC

(57) ABSTRACT

Provided is a display apparatus including a plurality of subpixels and configured to emit light based on each of the plurality of subpixels, the display apparatus including a substrate, a driving layer provided on the substrate and including a driving element which is configured to apply current to the display apparatus, a first electrode electrically connected to the driving layer, a first semiconductor layer provided on the first electrode, an active layer provided on the first semiconductor layer, a second semiconductor layer provided on the active layer, a second electrode provided on the second semiconductor layer, and a reflective layer provided on the second semiconductor layer, wherein light emitted from the active layer resonates between the first electrode and the reflective layer.

12 Claims, 29 Drawing Sheets

Related U.S. Application Data continuation of application No. 16/857,362, filed on Apr. 24, 2020, now Pat. No. 11,430,374.

(51) Int. Cl.
 *H01L 33/10* (2010.01)
 *H01L 33/34* (2010.01)

(58) Field of Classification Search
 CPC ............... H01L 33/0093; H01L 25/167; H01L 25/0753; H01L 33/14; H01L 33/145; H01L 33/46; H01L 2933/0041; H01L 51/5271; H01L 27/1214; H01L 27/3211; H01L 27/3262; H01L 51/56
 See application file for complete search history.

(56) References Cited

U.S. PATENT DOCUMENTS

| | | | |
|---|---|---|---|
| 10,388,641 B2 | 8/2019 | Martin | |
| 2008/0299718 A1* | 12/2008 | Jiang | H01L 21/76808 438/197 |
| 2009/0179563 A1* | 7/2009 | Jun | H01L 27/3206 313/506 |
| 2010/0073615 A1* | 3/2010 | Yaguchi | G02F 1/133305 349/122 |
| 2011/0084294 A1 | 4/2011 | Yao | |
| 2012/0001218 A1* | 1/2012 | Choi | H01L 33/16 257/98 |
| 2012/0056303 A1* | 3/2012 | Cho | H01L 27/0802 257/536 |
| 2012/0223875 A1* | 9/2012 | Lau | H01L 27/156 345/83 |
| 2013/0161667 A1* | 6/2013 | Chen | H01L 33/0093 257/91 |
| 2014/0023102 A1 | 1/2014 | Holder et al. | |
| 2014/0061595 A1 | 3/2014 | Kim et al. | |
| 2014/0295597 A1* | 10/2014 | Sato | H01L 51/5036 438/29 |
| 2015/0102331 A1* | 4/2015 | Seo | H01L 51/0074 257/40 |
| 2016/0233274 A1* | 8/2016 | Park | H01L 51/5268 |
| 2018/0026169 A1* | 1/2018 | Shioji | H01L 33/60 257/98 |
| 2018/0068995 A1* | 3/2018 | Kajiyama | H01L 25/50 |
| 2018/0190878 A1 | 7/2018 | Li et al. | |
| 2018/0358405 A1* | 12/2018 | Chaji | H01L 24/92 |
| 2019/0189701 A1* | 6/2019 | Bang | H01L 51/5271 |
| 2019/0221710 A1 | 7/2019 | Bonar et al. | |
| 2019/0237630 A1* | 8/2019 | Check | H01L 33/42 |
| 2019/0355785 A1 | 11/2019 | Wu et al. | |
| 2020/0066942 A1 | 2/2020 | Wang et al. | |
| 2020/0168663 A1 | 5/2020 | Choi et al. | |
| 2020/0212102 A1* | 7/2020 | Park | H01L 27/156 |
| 2021/0336075 A1* | 10/2021 | Chen | H01L 33/0093 |

OTHER PUBLICATIONS

Masaru Kuramoto et al., "High-Power GaN-Based Vertical-Cavity Surface-Emitting Lasers with AlInN/GaN Distributed Bragg Reflectors", Applied Sciences, 9, 416, doi:10.3390, 2019, pp. 1-13, 13 pages total.

Tien-Chang Lu et al., "CW lasing of current injection blue GaN-based vertical cavity surface emitting laser", Applied Physics Letters, 92, 141102, 2008, pp. 1-3, 4 pages total.

Communication issued Jul. 28, 2024 by the Korean Patent Office in KR Application No. 10-2019-0164792.

* cited by examiner

DISPLAY APPARATUS AND METHOD OF MANUFACTURING THE SAME

CROSS-REFERENCE TO THE RELATED APPLICATION

This application is a divisional of U.S. application Ser. No. 17/725,935, filed Apr. 21, 2022, which is a continuation of U.S. application Ser. No. 16/857,362, which claims priority from Korean Patent Application No. 10-2019-0164792, filed on Dec. 11, 2019, in the Korean Intellectual Property Office, the disclosure of which is incorporated herein in its entirety by reference.

BACKGROUND

1. Field

Example embodiments of the present disclosure relate to high-resolution display apparatuses configured to decrease the divergence angle of a beam, and methods of manufacturing the display apparatuses.

2. Description of Related Art

Liquid crystal displays (LCDs) and organic light-emitting diode (OLED) displays are widely used as display apparatuses. In addition, recently, there is increasing interest in technology for manufacturing high-resolution display apparatuses using micro light-emitting diodes (LEDs). Light-emitting diodes (LEDs) have the advantages of low power consumption and environmental friendliness. Owing to these advantages, industrial demand for LEDs has increased. Therefore, displays using micro LEDs have been developed.

However, as the pitch between neighboring pixels is decreased to increase the resolution of micro LED displays, light emitted from pixels may spread to neighboring pixels, and thus color purity may deteriorate.

In addition, micro LED displays may be manufactured by manufacturing driving elements such as thin-film transistors (TFTs) or complementary metal-oxide semiconductor (CMOS) elements separately from LEDs, and bonding the driving elements and the LEDs together. In this case, however, defects may be formed in electrical connection portions during bonding, and unstable bonds may be formed because of thermal mismatches.

SUMMARY

One or more example embodiments provide display apparatuses having a small beam diverging angle.

One or more example embodiments provide methods of more easily manufacturing display apparatuses.

Additional aspects will be set forth in part in the description which follows and, in part, will be apparent from the description, or may be learned by practice of the example embodiments of the disclosure.

According to an aspect of an example embodiment, there is provided a display apparatus including a plurality of subpixels and configured to emit light based on each of the plurality of subpixels, the display apparatus including a substrate, a driving layer provided on the substrate and including a driving element which is configured to apply current to the display apparatus, a first electrode electrically connected to the driving layer, a first semiconductor layer provided on the first electrode, an active layer provided on the first semiconductor layer, a second semiconductor layer provided on the active layer, a second electrode provided on the second semiconductor layer, and a reflective layer provided on the second semiconductor layer, wherein light emitted from the active layer resonates between the first electrode and the reflective layer.

The reflective layer may include a distributed Bragg reflector.

The distributed Bragg reflector may include first layers having a first refractive index and second layers having a second refractive index that are alternately provided, and the first and second layers are provided in two to five pairs.

The display apparatus may further include a coupling layer provided between the substrate and the driving layer.

The substrate may include a silicon substrate, a glass substrate, a sapphire substrate, or a silicon substrate coated with $SiO_2$.

The driving element may include a transistor, a thin-film transistor, or a high-electron-mobility transistor (HEMT).

The display apparatus may further include an isolation structure isolating the active layer based on each of the plurality of subpixels.

The isolation structure may include an ion-implanted region.

The display apparatus may further include a current blocking layer provided in the driving layer and corresponding to the isolation structure.

The display apparatus may further include a current spreading layer between the first semiconductor layer and the reflective layer and between the reflective layer and the second electrode.

The display apparatus may further include a current spreading layer provided between the second semiconductor layer and the reflective layer and between the second semiconductor layer and the second electrode.

The second electrode may include a window region in a region facing the active layer, and a width of the active layer is less than a width of the window region.

The display apparatus may further include a plurality of color conversion layers configured to convert light emitted from the active layer into light having different colors.

The second electrode may be transparent and cover the second semiconductor layer.

The second electrode may be opaque and may include a window region configured to transmit light emitted from the active layer.

The substrate and the driving layer may form a complementary metal-oxide semiconductor (CMOS) backplane.

According to another aspect of an example embodiment, there is provided a method of manufacturing a display apparatus, the method including forming a first semiconductor layer on an epitaxial substrate, forming an active layer on the first semiconductor layer, forming a second semiconductor layer on the active layer, isolating the active layer based on each of a plurality of subpixels, forming a first electrode on the second semiconductor layer based on each of the plurality of subpixel, forming a driving layer which includes a driving element electrically connected to the first electrode, removing the epitaxial substrate, forming a second electrode on the first semiconductor layer, and forming a reflective layer on the second electrode.

The isolating of the active layer based on each of the plurality of subpixel may include forming an ion-implanted region.

The first electrode may include a reflective material configured to reflect light.

The method may further include bonding the driving layer to a second substrate by a fusion bonding method or a direct bonding method.

The second substrate and the driving layer may be formed through a complementary metal-oxide semiconductor (CMOS) backplane manufacturing process, and the driving layer and the first electrode may be coupled to each other by a copper damascene method.

The reflective layer may include a distributed Bragg reflector.

The second electrode may be transparent and cover the first semiconductor layer.

The second electrode may be opaque, and a window region may be formed in the second electrode to transmit light emitted from the active layer.

A width of the active layer may be less than a width of the window region.

The method may further include forming a plurality of color conversion layers based on each of a plurality of subpixels, the plurality of color conversion layer being configured to convert light emitted from the active layer into light having different colors.

The first electrode may face the active layer.

The method may further include forming a current spreading layer between the first semiconductor layer and the reflective layer and between the reflective layer and the second electrode.

The method may further include forming a current spreading layer between the first semiconductor layer and the reflective layer and between the first semiconductor layer and the second electrode.

According to an aspect of an example embodiment, there is provided a display apparatus including a plurality of subpixels and configured to emit light based on each of the plurality of subpixels, the display apparatus including a substrate, a driving layer provided on the substrate and including a driving element which is configured to apply current to the display apparatus, a first electrode electrically connected to the driving layer, a first semiconductor layer provided on the first electrode, an active layer provided on the first semiconductor layer, a second semiconductor layer provided on the active layer, a second electrode provided on the second semiconductor layer, a reflective layer provided on the second semiconductor layer, an isolation structure isolating the active layer based on each of the plurality of subpixels, and a current spreading layer provided between the second semiconductor layer and the reflective layer and between the reflective layer and the second electrode, wherein light emitted from the active layer resonates between the first electrode and the reflective layer.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
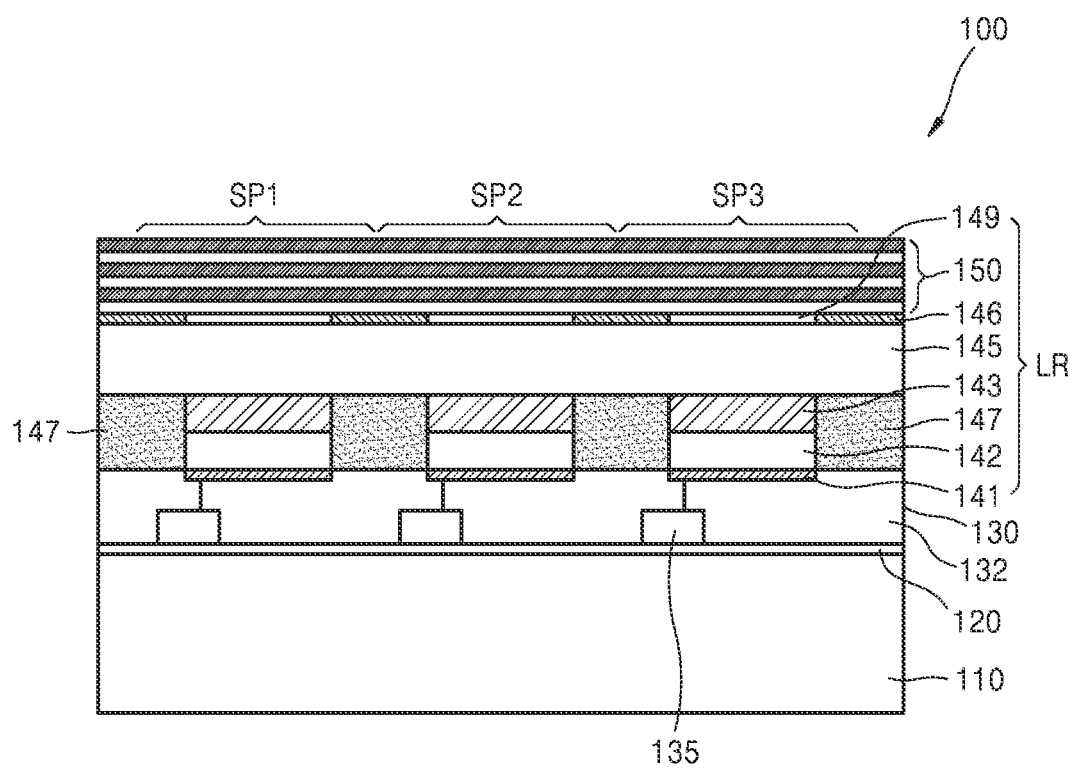
FIG. 1 is a schematic view illustrating a display apparatus according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, display apparatuses and methods of manufacturing the display apparatuses will be described according to various example embodiments with reference to the accompanying drawings. In the drawings, like reference numerals refer to like elements, and the sizes of elements may be exaggerated for clarity of illustration. It will be understood that although the terms of "first" and "second" are used herein to describe various elements, these elements should not be limited by these terms. These terms are only used to distinguish one element from another.

The terms of a singular form may include plural forms unless otherwise mentioned. It will be further understood that the terms "comprises" and/or "comprising" used herein specify the presence of stated features or elements, but do not preclude the presence or addition of one or more other features or elements. In the drawings, the size or thickness of each element may be exaggerated for clarity of illustration. In addition, when a material layer is referred to as being "above" or "on" a substrate or another layer, it can be directly on the substrate or the other layer, or intervening layers may also be present. In the following description, a material of each layer is an example. That is, another material may be used.

In the present disclosure, terms such as "unit" or "module" may be used to denote a unit that has at least one function or operation and is implemented with hardware, software, or a combination of hardware and software.

The operations described in the example embodiments are not intended to limit the scope of the present disclosure. For simplicity of description, electronic configurations, control systems, and software of the related art, and other functional aspects of the systems may not be described. Furthermore, line connections or connection members between elements depicted in the drawings represent functional connections and/or physical or circuit connections by way of example, and in actual applications, they may be replaced or embodied with various additional functional connections, physical connections, or circuit connections.

An element referred to with the definite article or a demonstrative pronoun may be construed as the element or the elements even though it has a singular form.

Operations of a method may be performed in appropriate order unless explicitly described in terms of order or described to the contrary. In addition, examples or exemplary terms (for example, "such as" and "etc.") are used for the purpose of description and are not intended to limit the scope of the inventive concept unless defined by the claims.

FIG. 1 is a schematic cross-sectional view illustrating a display apparatus 100 according to an example embodiment.

Referring to FIG. 1, although the display apparatus 100 may a plurality of pixels, only one pixel is illustrated as an example. Each of the pixels may be one unit for displaying images. Each of the pixels may include subpixels emitting different colors. Images may be displayed by controlling colors and the amounts of light emitted by the subpixels. For example, each of the pixels may include a first subpixel SP1, a second subpixel SP2, and a third subpixel SP3.

The display apparatus 100 may include a substrate 110, a driving layer 130 provided on the substrate 110, and a light-emitting resonance layer LR provided on the driving layer 130.

The substrate 110 may be a substrate for supporting the driving layer 130 thereon. In other words, the substrate 110 may not be a growth substrate. For example, a silicon substrate, a glass substrate, a sapphire substrate, or a silicon substrate coated with silicon oxide ($SiO_2$) may be used as the substrate 110. However, these are merely examples, and substrates made of various materials may be examples of the substrate 110. The substrate 110 may be a substrate used for a complementary metal-oxide semiconductor (CMOS) backplane. In this case, the substrate 110 and the driving layer 130 may form a CMOS backplane.

The driving layer 130 may include driving elements 135 for electrically driving the light-emitting resonance layer LR. The driving elements 135 may include, for example, a transistor, a thin-film transistor (TFT), or a high electron-mobility-transistor (HEMT). The driving layer 130 may further include at least one insulating layer 132.

The coupling layer 120 may be provided between the substrate 110 and the driving layer 130. The coupling layer 120 is for coupling the driving layer 130 to the substrate 110 and may include, for example, an adhesive layer, a fusion bonding layer or a direct bonding layer. The adhesive layer may include, for example, epoxy, spin on glass (SOG), or benzocyclobutene (BCB). The direct bonding layer may be formed by, for example, plasma or ion beam treatment. The coupling layer 120 is configured to physically bond the driving layer 130 to the substrate 110, and may bond the driving layer 130 to the substrate 110 by a bonding method that does not require electrical connection.

When the substrate 110 and the driving layer 130 form a CMOS backplane, the coupling layer 120 may not be provided.

The light-emitting resonance layer LR may include a micro light-emitting diode (LED) array and a resonant structure. The light-emitting resonance layer LR may include first electrodes 141, a first semiconductor layer 142, an active layer 143, a second semiconductor layer 145, a second electrode 146, and a reflective layer 150.

The first semiconductor layer 142 may include a first-type semiconductor. For example, the first semiconductor layer 142 may include a p-type semiconductor. The first semiconductor layer 142 may include a p-type semiconductor of group III-V group, for example, p-GaN. The first semiconductor layer 142 may have a single-layer structure or a multilayer structure.

The active layer 143 may be provided on an upper surface of the first semiconductor layer 142. The active layer 143 may generate light while electrons and holes are bound together. The active layer 143 may have a multi-quantum well (MQW) structure or a single-quantum well (SQW) structure. The active layer 143 may include a semiconductor of group III-V, for example, gallium nitride (GaN).

The second semiconductor layer 145 may be provided on an upper surface of the active layer 143. The second semiconductor layer 145 may include, for example, an n-type semiconductor. In another example, the second semiconductor layer 145 may include a p-type semiconductor. The second semiconductor layer 145 may include an n-type semiconductor of group III-V, for example, n-GaN. The second semiconductor layer 145 may have a single-layer structure or a multilayer structure.

The light-emitting resonance layer LR may have an isolation structure 147 such that light may be emitted from the active layer 143 in a subpixel basis. The light-emitting resonance layer LR may include the isolation structure 147 between neighboring subpixels. The isolation structure 147 may be, for example, an ion-implanted region. Here, ions implanted into the ion-implanted region may include, for example, nitrogen (N) ions, boron (B) ions, argon (Ar) ions, or phosphorus (P) ions. Since no current is injected in the ion-implanted region, no light is emitted from the ion-implanted region. When the isolation structure 147 is formed by the ion-implanted region, a light-emitting structure may be formed without a mesa structure. The isolation structure 147 may make it possible to implement a micro light-emitting device array structure without an etching process. Since an etching process is not used, smaller subpixels may be formed, and thus a higher-resolution micro light-emitting device array may be manufactured.

The first electrodes 141 may be electrically connected to the first semiconductor layer 142, and the second electrode 146 may be electrically provided to the second semiconductor layer 145. The first electrodes 141 may be pixel electrodes corresponding to each subpixel, and the second electrode 146 may be a common electrode corresponding to a plurality of subpixels. When the first semiconductor layer 142 and the second semiconductor layer 145 respectively include a p-type semiconductor and an n-type semiconductor, the first electrode 141 and the second electrode 146 may respectively be a p-type electrode and an n-type electrode. The driving elements 135 may be electrically connected to the first electrodes 141, and may control power provided to the first electrodes 141. Therefore, the driving elements 135 may selectively drive, at least one of the first subpixel SP1, the second subpixel SP2, and the third subpixel SP3.

The first electrodes 141 may include a reflective material to reflect light emitted downward from the active layer 143. The first electrodes 141 may include, for example, silver (Ag), gold (Au), aluminum (Al), chromium (Cr), nickel (Ni), or an alloy thereof. The second electrode 146 may be formed as a transparent electrode or an opaque electrode. For example, the transparent electrode may include indium tin oxide (ITO), zinc oxide (ZnO), indium zinc oxide (IZO), indium gallium zinc oxide (IGZO), or the like. When the second electrode 146 is formed as a transparent electrode, the second electrode 146 may be arranged to cover the entirety of the second semiconductor layer 145. When the second electrode 146 is an opaque electrode, the second electrode 146 may further include window regions 149 corresponding to the active layer 143, and configured to transmit light emitted from the active layer 143.

The reflective layer 150 may repeatedly reflect light emitted from the active layer 143 together with the first electrodes 141 such that the light may resonate. The reflective layer 150 may be, for example, a distributed Bragg reflector. Since light emitted from the active layer 143 resonates between the first electrodes 141 and the reflective layer 150, and then leaves the display apparatus 100, the divergence angle of a beam may be reduced. Therefore, in a high-resolution display apparatus, crosstalk between neighboring subpixels may be reduced to increase color purity.

Figure 2:
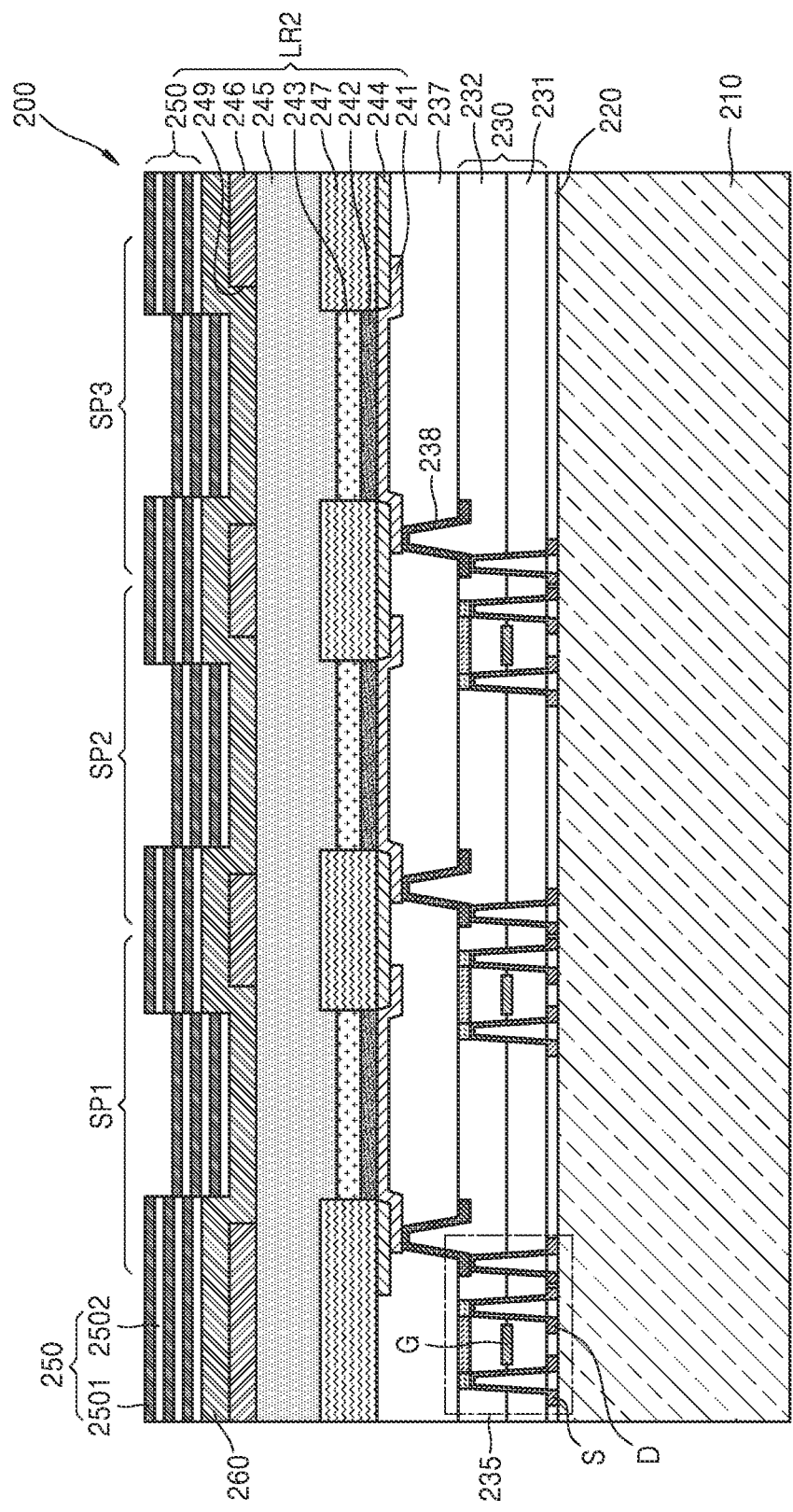
FIG. 2 is a view illustrating a display apparatus according to another example embodiment.

FIG. 2 is a view illustrating a display apparatus 200 according to an example embodiment.

The display apparatus 200 may include a first subpixel SP1, a second subpixel SP2, and a third subpixel SP3. The first subpixel SP1, the second subpixel SP2, and the third subpixel SP3 may emit light having different colors. The display apparatus 200 may include a substrate 210, a driving layer 230 provided on the substrate 210, and a light-emitting resonance layer LR2 provided on the driving layer 230.

The substrate 210 may not be a growth substrate, but may be a substrate for supporting the driving layer 230 thereon. For example, a silicon substrate, a glass substrate, a sapphire substrate, or a silicon substrate coated with $SiO_2$ may be used as the substrate 210. However, these are merely examples, and substrates made of various materials may be examples of the substrate 210. The substrate 210 may be a substrate used for a CMOS backplane. In this case, the substrate 210 and the driving layer 230 may form a CMOS backplane.

The driving layer 230 may include driving elements 235 for electrically driving the light-emitting resonance layer LR2 on a subpixel basis. The driving elements 235 may include, for example, a transistor, a TFT, or an HEMT. For example, each of the driving elements 235 may include a gate electrode G, a source electrode S, and a drain electrode D. The driving layer 230 may further include at least one insulating layer. For example, the at least one insulating layer may include a first insulating layer 231 and a second insulating layer 232. The second insulating layer 232 may be, for example, a gate oxide. A third insulating layer 237 may be further provided between the driving layer 230 and the light-emitting resonance layer LR2.

A coupling layer 220 may be provided between the substrate 210 and the driving layer 230. The coupling layer 220 is configured to bond the driving layer 230 to the substrate 210, and may include, for example, an adhesive layer, a fusion bonding layer or a direct bonding layer. The coupling layer 220 is configured to physically bond the driving layer 230 to the substrate 210, and may bond the driving layer 230 to the substrate 210 by a bonding method that does not require electrical connection. For example, the coupling layer 220 may cover the source electrodes S and the drain electrodes D during a bonding process. The coupling layer 220 is not limited to the thickness shown in FIG. 2, and may have various thicknesses. The coupling layer 220 may have a thickness, for example, within the range of 2-5 µm.

The light-emitting resonance layer LR2 may include a micro light-emitting device array such as a micro LED array, and a resonant structure. The light-emitting resonance layer LR2 may include first electrodes 241, a first semiconductor layer 242, an active layer 243, a second semiconductor layer 245, a second electrode 246, and a reflective layer 250.

The first semiconductor layer 242 may include a first-type semiconductor. For example, the first semiconductor layer 242 may include a p-type semiconductor. The first semiconductor layer 242 may include a p-type semiconductor of group III-V group, for example, p-GaN. The first semiconductor layer 242 may have a single-layer structure or a multilayer structure.

The active layer 243 may be provided on an upper surface of the first semiconductor layer 242. The active layer 243 may generate light while electrons and holes are bound together. The active layer 243 may have a MQW structure or a SQW structure. The active layer 243 may include a semiconductor of group III-V, for example, GaN. The active layer 243 may include a two-dimensional thin film structure, or may include a three-dimensional structure such as a rod or pyramid structure.

The second semiconductor layer 245 may be provided on an upper surface of the active layer 243. The second semiconductor layer 245 may include, for example, an n-type semiconductor. The second semiconductor layer 245 may include an n-type semiconductor of group III-V, for example, n-GaN. The second semiconductor layer 245 may have a single-layer structure or a multilayer structure.

The light-emitting resonance layer LR2 may include, for example, inorganic substance-based micro LEDs. The micro LEDs may be provided in subpixels, respectively. The light-emitting resonance layer LR2 may have an isolation structure 247 such that light may be emitted from the active layer 243 in a subpixel basis. The active layer 243 may be arranged as discrete regions that are separated by the isolation structure 247. The isolation structure 247 may be, for example, an ion-implanted region. Since no current is injected in the ion-implanted region, no light is emitted from the ion-implanted region. The ion-implanted may be formed by implanting ions such as nitrogen ions or boron ions, and may provide insulation. In the ion-implanted region, ions may be implanted with a dose of about $10^{12}$ ions/cm$^2$ to about $10^{20}$ ions/cm$^2$. However, embodiments are not limited thereto.

The first electrodes 241 may be electrically connected to the first semiconductor layer 242, and the second electrode 246 may be electrically provided to the second semiconductor layer 245. The first electrodes 141 may be pixel electrodes corresponding to each subpixel, and the second electrode 146 may be a common electrode corresponding to a plurality of subpixels. When the first semiconductor layer 242 and the second semiconductor layer 245 respectively include a p-type semiconductor and an n-type semiconductor, the first electrodes 241 may be p-type electrodes, and the second electrode 246 may be an n-type electrode. The driving elements 235 may be electrically connected to the first electrodes 241, and may control power provided to the first electrodes 241. Therefore, the driving elements 235 may selectively drive, at least one of the first subpixel SP1, the second subpixel SP2, and the third subpixel SP3.

The first electrodes 241 may include a reflective material to reflect light emitted downward from the active layer 243. The first electrodes 241 may include, for example, silver (Ag), gold (Au), aluminum (Al), chromium (Cr), nickel (Ni), or an alloy thereof. The first electrodes 241, which are pixel electrodes, may independently drive the subpixels. The first electrodes 241 may be arranged to be spaced apart from each other and face the active layer 243. A current blocking layer 244 may be further provided at both lateral ends of each of the first electrodes 241. The current blocking layer 244 may prevent leakage of current to other adjacent subpixel areas. The current blocking layer 244 may include, for example, a silicon oxide or a silicon nitride. The current blocking layer 244 may include, for example, $SiO_2$. The current blocking layer 244 may be provided between a lower surface of the isolation structure 247 and the first electrodes 241. The current blocking layer 244 may be arranged to correspond to a lower portion of the isolation structure 247.

The third insulating layer 237 may be further provided between the driving layer 230 and the light-emitting resonance layer LR2. The via holes 238 may be further provided in the third insulating layer 237 to electrically connect the driving elements 235 and the first electrodes 241 to each other.

The second electrode 246 may be formed as a transparent electrode or an opaque electrode. The opaque electrode may include, for example, titanium (Ti) or nickel (Ni). For example, the transparent electrode may include ITO, ZnO, IZO, IGZO, or the like. When the second electrode 246 is formed as a transparent electrode, the second electrode 246 may be arranged to cover the entirety of the second semiconductor layer 245. When the second electrode 246 is an opaque electrode, the second electrode 246 may further include window regions 249 to transmit light emitted from the active layer 243. The window regions 249 may be provided at positions corresponding to the active layer 243.

The isolation structure 247 may have a predetermined thickness from the first semiconductor layer 242. The isolation structure 247 may have a thickness to prevent current from being injected into the second semiconductor layer 245 from the first electrodes 241. Although it is required to control current injected from the first electrodes 241 into the first semiconductor layer 242 on a subpixel basis, current may be injected into the entirety of the second semiconductor layer 245, and thus the isolation structure 247 may not be required to extend to an upper surface of the second semiconductor layer 245. For example, the isolation structure 247 may have a thickness equal to or greater than the sum of the thickness of the first semiconductor layer 242 and the thickness of the active layer 243. The isolation structure 247 may have a thickness to provide isolation for the first semiconductor layer 242 and the second semiconductor layer 245 as well.

The reflective layer 250 may reflect light emitted from the active layer 243. Light emitted from the active layer 243 may be repeatedly reflected and resonate between the first electrodes 241 and the reflective layer 250, and may then be extracted through the reflective layer 250. Resonating light may be output with a smaller divergence angle. Therefore, crosstalk between neighboring subpixels may be reduced. The reflective layer 250 may be, for example, a distributed Bragg reflector. Here, reference numeral 250 used to indicate the reflective layer will also be used to indicate the distributed Bragg reflector.

The distributed Bragg reflector 250 may be formed by alternately repeatedly stacking first layer 2501 and second layer 2502 having different refractive indexes. Due to the difference in refractive index, all waves reflected at interfaces of the first and second layers 2501 and 2502 may interfere with each other. For example, the distributed Bragg reflector 250 may have a structure in which layers including two of Si, $Si_3N_4$, $SiO_2$, $TiO_2$, $Ta_2O_5$, and $ZrO_2$ are alternately stacked. For example, the distributed Bragg reflector 250 may have a structure in which $SiO_2$ and $TiO_2$ layers are alternately stacked. The light reflectivity of the distributed Bragg reflector 250 may be controlled by adjusting the thicknesses and number of the two types of stacked layers.

For example, the distributed Bragg reflector 250 may have a structure in which two to five pairs of first and second layers 2501 and 2502 are stacked.

A current spreading layer 260 may be further provided between the reflective layer 250 and the second electrode 246. The current spreading layer 260 may include a transparent material that transmits light. The current spreading layer 260 may include, for example, ITO. The current spreading layer 260 may increase the light emission efficiency of the active layer 243 by spreading current applied through the second electrode 246.

In the example embodiment, a downward portion of light emitted from the active layer 243 may be reflected by the first electrodes 241 and may be directed upward, and since the isolation structure 247 does not have a mesa structure, a lateral portion of the light emitted from the active layer 243 propagates upward without being absorbed or scattered by the isolation structure 247. Therefore, light emission efficiency may be improved. In addition, owing to the isolation structure 247, the size of the subpixels may be reduced, and thus the resolution of the display apparatus 200 may be increased. In addition, the example embodiment may have a vertical electrode structure in which the first electrodes 241 and the second electrode 246 are arranged on upper and lower sides with respect to the active layer 243.

Figure 3:
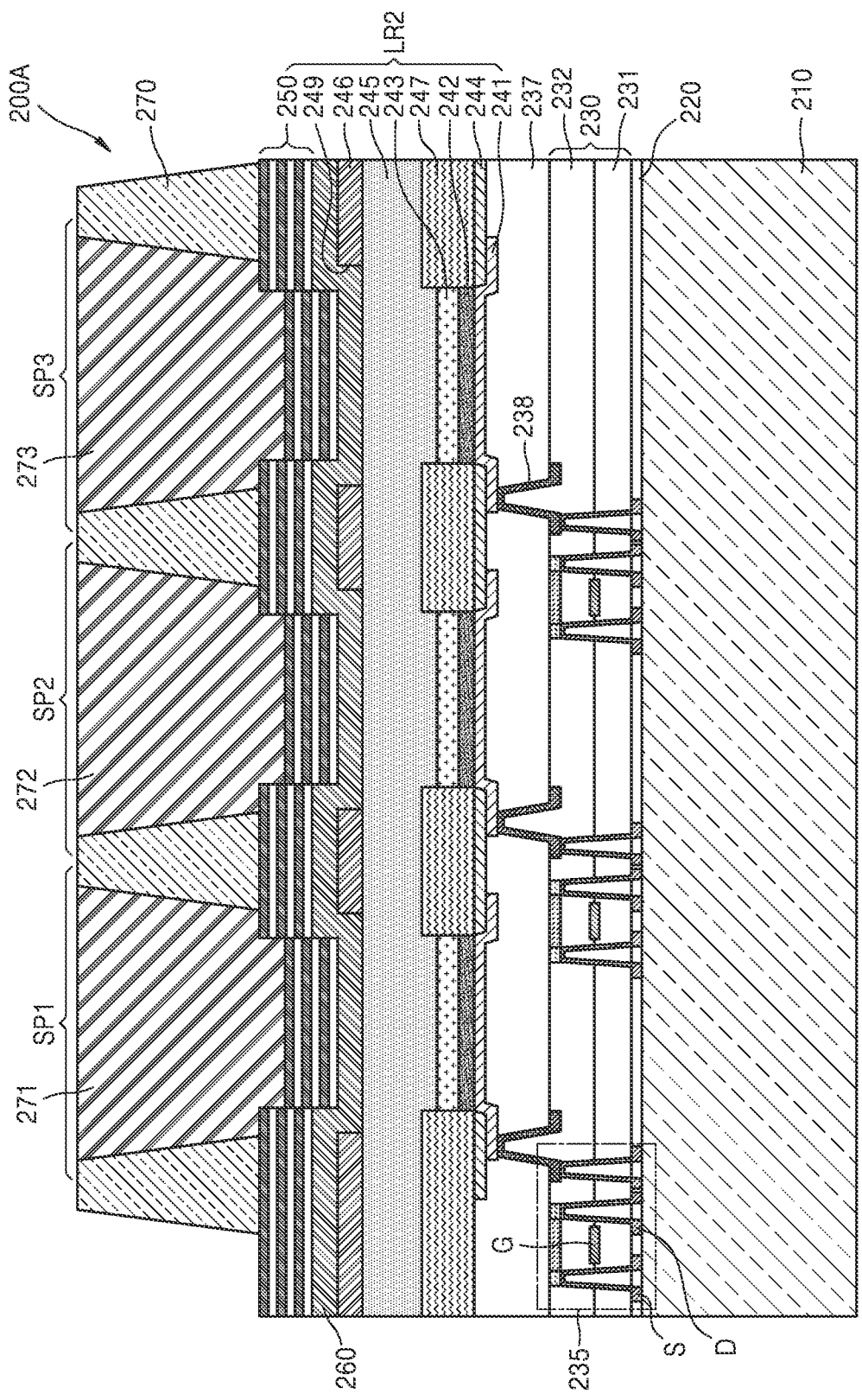
FIG. 3 is a view illustrating a structure in which color conversion layers are further provided in the display apparatus shown in FIG. 2.

FIG. 3 is a view illustrating a display apparatus 200A in which a color conversion layer is further included in the structure shown in FIG. 2. In FIG. 3, components denoted with the same reference numerals as those in FIG. 2 have substantially the same functions and structures as those described with reference to FIG. 2, and thus detailed descriptions thereof will be omitted.

The display apparatus 200A may include the substrate 210, the driving layer 230, the light-emitting resonance layer LR2, and a color conversion layer.

A plurality of color conversion layers 271, 272, and 273 may be provided on upper portions of the reflective layer 250 to receive light emitted from the active layer 243 and emit light having different colors. For example, the active layer 243 may emit blue light. However, this is only an example, and the active layer 243 may emit light having a different wavelength capable of exciting the color conversion layers 271, 272, and 273. The color conversion layers 271, 272, and 273 may respectively correspond to subpixels SP1, SP2, and SP3. The color conversion layers 271, 272, and 273 may include, for example, a blue conversion layer 271, a green conversion layer 272, and a red conversion layer 273. The blue conversion layer 271 may correspond to a blue subpixel, the green conversion layer 272 may correspond to a green subpixel, and the red conversion layer 273 may correspond to a red subpixel.

The blue conversion layer 271 may include, for example, a material for emitting blue light, or may be a transmission layer that transmits blue light emitted from the active layer 243.

The blue conversion layer 271 may output blue light to the outside by transmitting blue light emitted from the active layer 243. The blue conversion layer 271 may further include a photoresist having good transmission characteristics or a light scattering agent.

The green conversion layer 272 may output green light to the outside by receiving blue light emitted from the active layer 243. The green conversion layer 272 may include quantum dots (QDs) having a predetermined size and capable of emitting green light while being excited by blue light. The quantum dots may have a core-shell structure having a core portion and a shell portion, or may have a particle structure having no shell. The core-shell structure may have a single-shell or multi-shell structure. The multi-shell structure may be, for example, a double-shell structure.

The quantum dots may include, for example, at least one selected from the group consisting of a group II-VI semiconductor, a group III-V semiconductor, a group IV-VI semiconductor, a group IV semiconductor, and graphene quantum dots. For example, the quantum dots may include at least one selected from the group consisting of cadmium (Cd), selenium (Se), zinc (Zn), sulfur (S), and InP, but are not limited thereto. Each of the quantum dots may have a diameter of several tens of nanometers (nm) or less, for example, about 10 nm or less. In addition, the green conversion layer 272 may include a phosphor capable of emitting green light while being excited by blue light emitted from the active layer 243. In addition, the green conversion layer 272 may further include a photoresist having good transmission characteristics or a light scattering agent capable of uniformly outputting green light.

The red conversion layer 273 may output red light by converting blue light emitted from the active layer 243. The red conversion layer 273 may include quantum dots having a predetermined size and capable of emitting red light while being excited by blue light. In addition, the red conversion layer 273 may include a phosphor capable of emitting red light while being excited by blue light emitted from the active layer 243. In addition, the red conversion layer 273 may further include a photoresist or a light scattering agent.

The color conversion layers 271, 272, and 273 may have a cross-sectional shape having an upwardly increasing width. A barrier 270 may be provided between the color conversion layers 271, 272, and 273 neighboring each other. The barrier 270 may be formed by a black matrix for absorbing light. The black matrix may improve contrast by preventing or reducing crosstalk between the blue conversion layer 271, the green conversion layer 272, and the red conversion layer 273.

For example, each of the subpixels SP1, SP2, and SP3 of the light-emitting resonance layer LR2 may emit blue light, and the color conversion layer of each of the subpixels SP1, SP2, and SP3 may output light having a corresponding color by converting the blue light. The amount of light may be controlled by adjusting the amounts of current injected into the first electrodes 241 and the second electrode 246, and the color conversion layer of each subpixel may output color light, such that color images may be displayed. Even when the size of each subpixel is reduced, light leakage to neighboring subpixels may be reduced or prevented based on the isolation structure 247, thereby increasing the resolution of the display apparatus 200A. In addition, since light resonates in the light-emitting resonance layer LR2 and is then output from the light-emitting resonance layer LR2, the divergence angle of a beam may be small, thereby reducing crosstalk between neighboring subpixels, increasing color purity, and reducing the loss of light.

Figure 4:
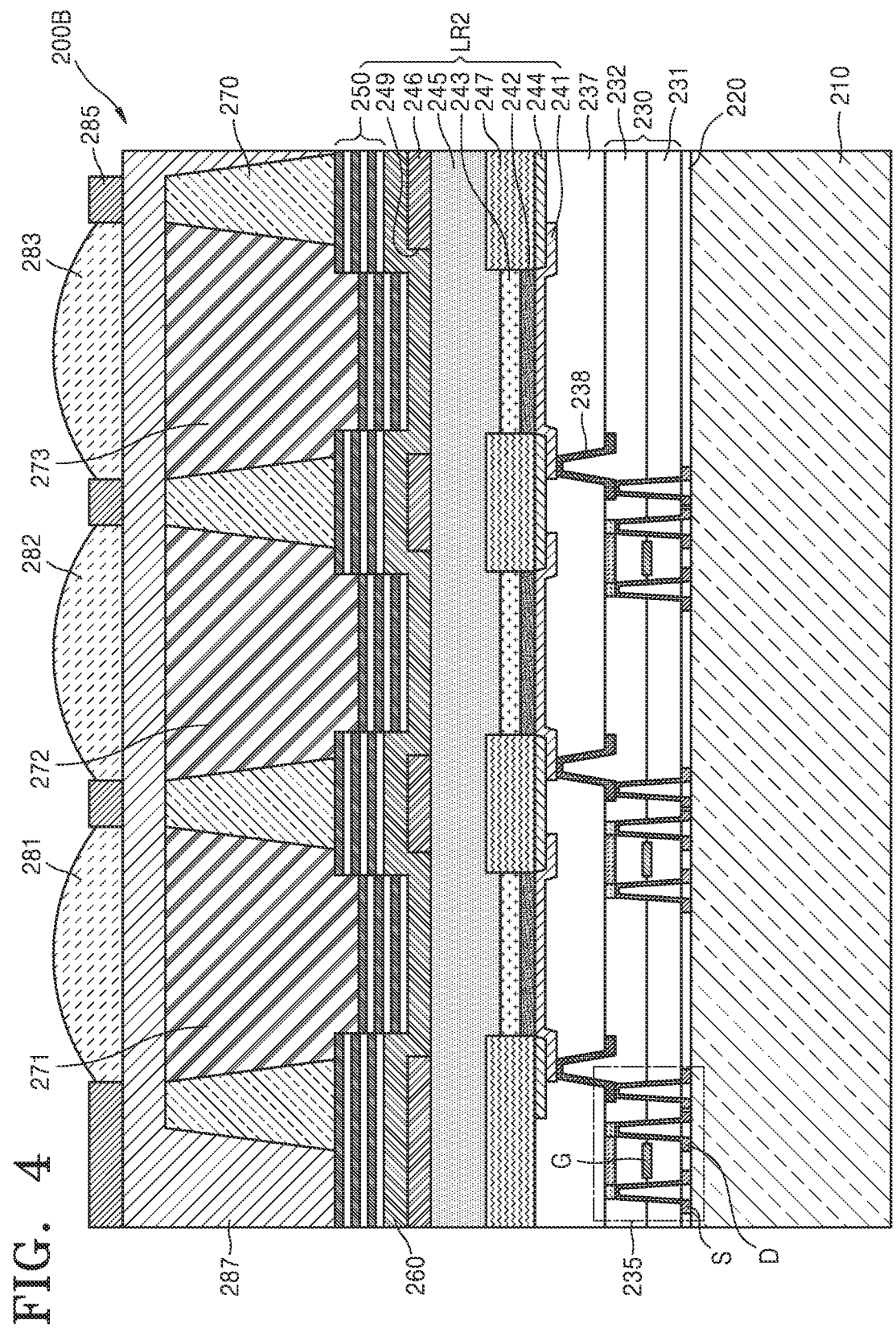
FIG. 4 is a view illustrating a structure in which color filter layers are further provided in the display apparatus shown in FIG. 3.

FIG. 4 is a view illustrating a display apparatus 200B in which color filter layers are further included in the structure shown in FIG. 3. In FIG. 4, components denoted with the same reference numerals as those in FIG. 3 have substantially the same functions and structures as those described with reference to FIGS. 2 and 3, and thus detailed descriptions thereof will be omitted.

Color filter layers 281, 282, and 283 corresponding to upper portions of the color conversion layers 271, 272, and 273 may be provided. Each of the color filter layers 281, 282, and 283 may transmit a corresponding color. The color filter layers 281, 282, and 283 may be provided to prevent blue light emitted from the active layer 243 from being output through an unintended subpixel. The color filter layers 281, 282, and 283 may further increase color purity. A black matrix 285 may be further provided in spaces between the color filter layers 281, 282, and 283. In addition, a protective layer 287 may be further provided between the color conversion layers 271, 272, and 273 and the color filter layers 281, 282, and 283. The protective layer 287 may function as a planarization layer.

Figure 5:
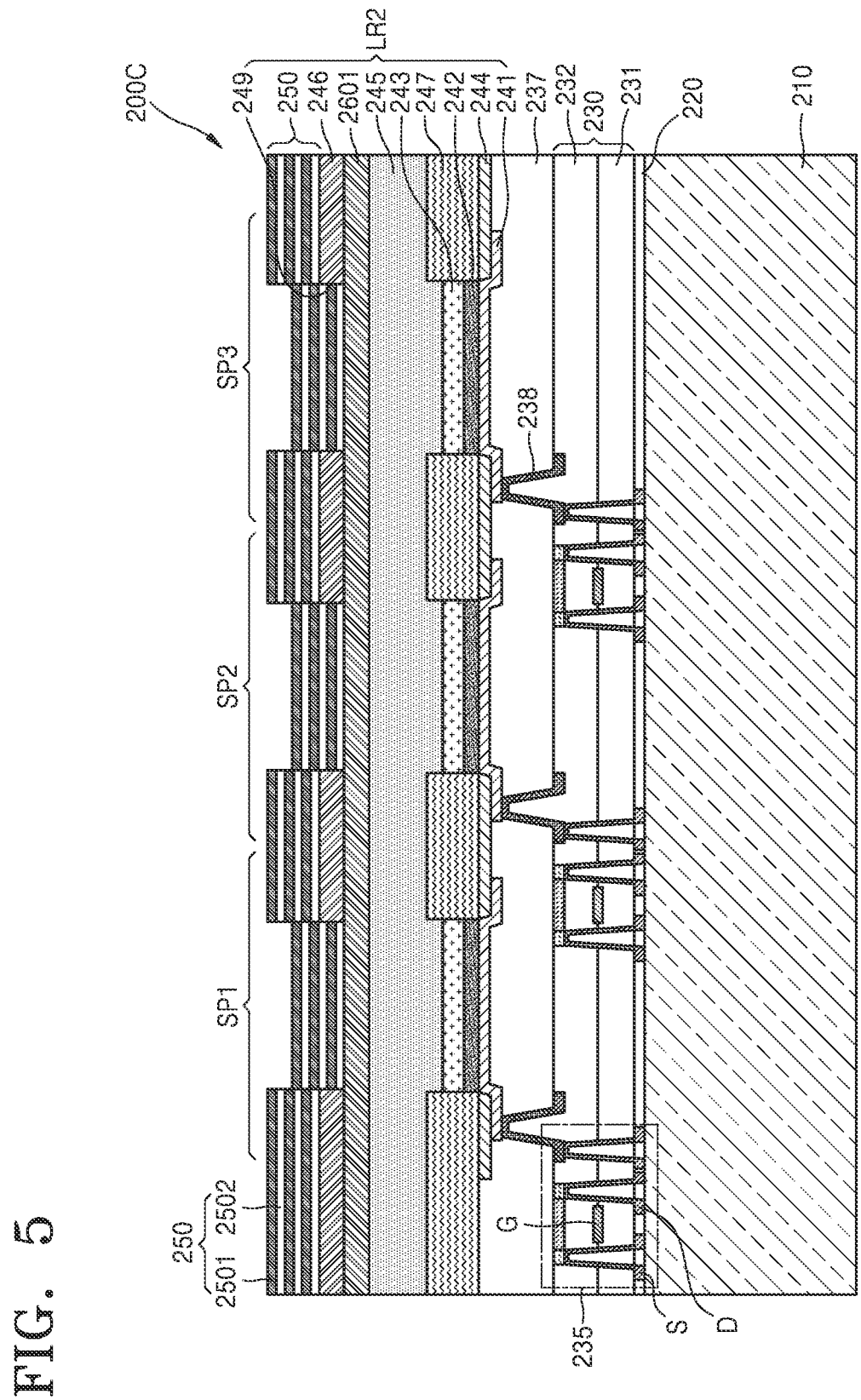
FIG. 5 is a view illustrating a modification example in which a current spreading layer of the display apparatus shown in FIG. 2 is modified.

FIG. 5 is a view illustrating a modification of the display apparatus 200 according to an example embodiment.

A display apparatus 200C is provided by modifying the current spreading layer 260 in the structure shown in FIG. 2. In FIG. 5, components denoted with the same reference numerals as those in FIG. 2 have substantially the same functions and structures as those described with reference to FIG. 2, and thus detailed descriptions thereof will be omitted.

The display apparatus 200C includes a current spreading layer 2601 between the second semiconductor layer 245 and the second electrode 246. The current spreading layer 2601 may have a planar shape throughout the first to third subpixels SP1, SP2, and SP3. The current spreading layer 2601 may include a transparent material that transmits light. For example, the current spreading layer 2601 may include ITO.

Figure 6:
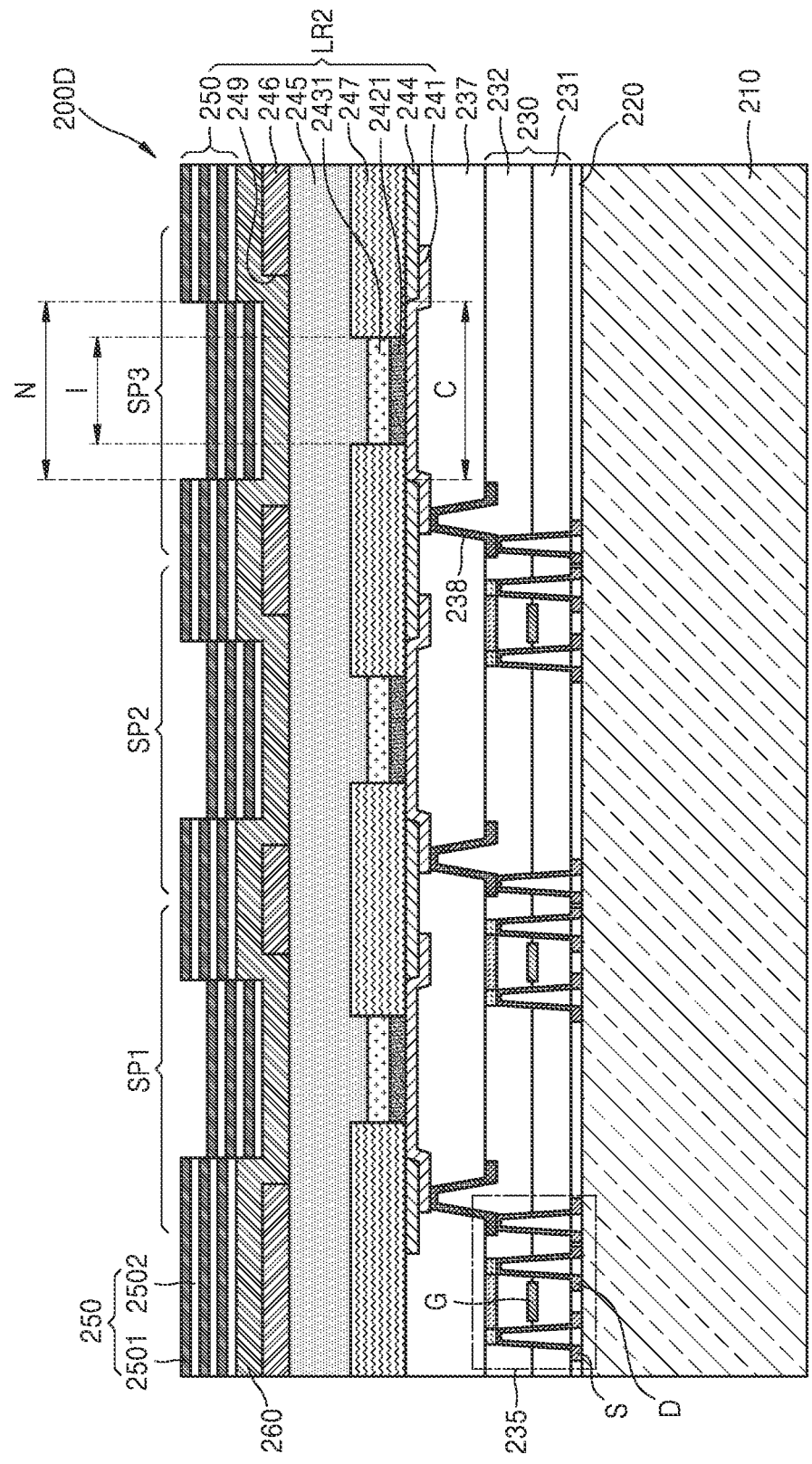
FIG. 6 is a view illustrating a display apparatus according to another example embodiment.

FIG. 6 is a view illustrating another modification of the display apparatus 200 shown in FIG. 2. In FIG. 6, components denoted with the same reference numerals as those in FIG. 2 have substantially the same functions and structures as those described with reference to FIG. 2, and thus detailed descriptions thereof will be omitted.

When compared with the display apparatus 200 shown in FIG. 2, a display apparatus 200D in which an active layer 2431 having a different width I is provided. The width I of the active layer 2431 may be less than the width N of the window regions 249 of the second electrode 246. The width I of the active layer 2431 may be less than a spacing C of the current blocking layer 244. The width N of the window regions 249 may be greater than or equal to the spacing C of the current blocking layer 244. The width I of the active layer 2431 may be set to be less than the width N of the window regions 249 and the spacing C of the current blocking layer 244, and thus current supplied through the first electrodes 241 and the second electrode 246 may be confined in the active layer 2431. Based on this configuration, the light emission efficiency of the active layer 2431 may be improved. A first semiconductor layer 2421 may also be configured to have a width less than the width N of the window regions 249 and the spacing C of the current blocking layer 244.

Figure 7:
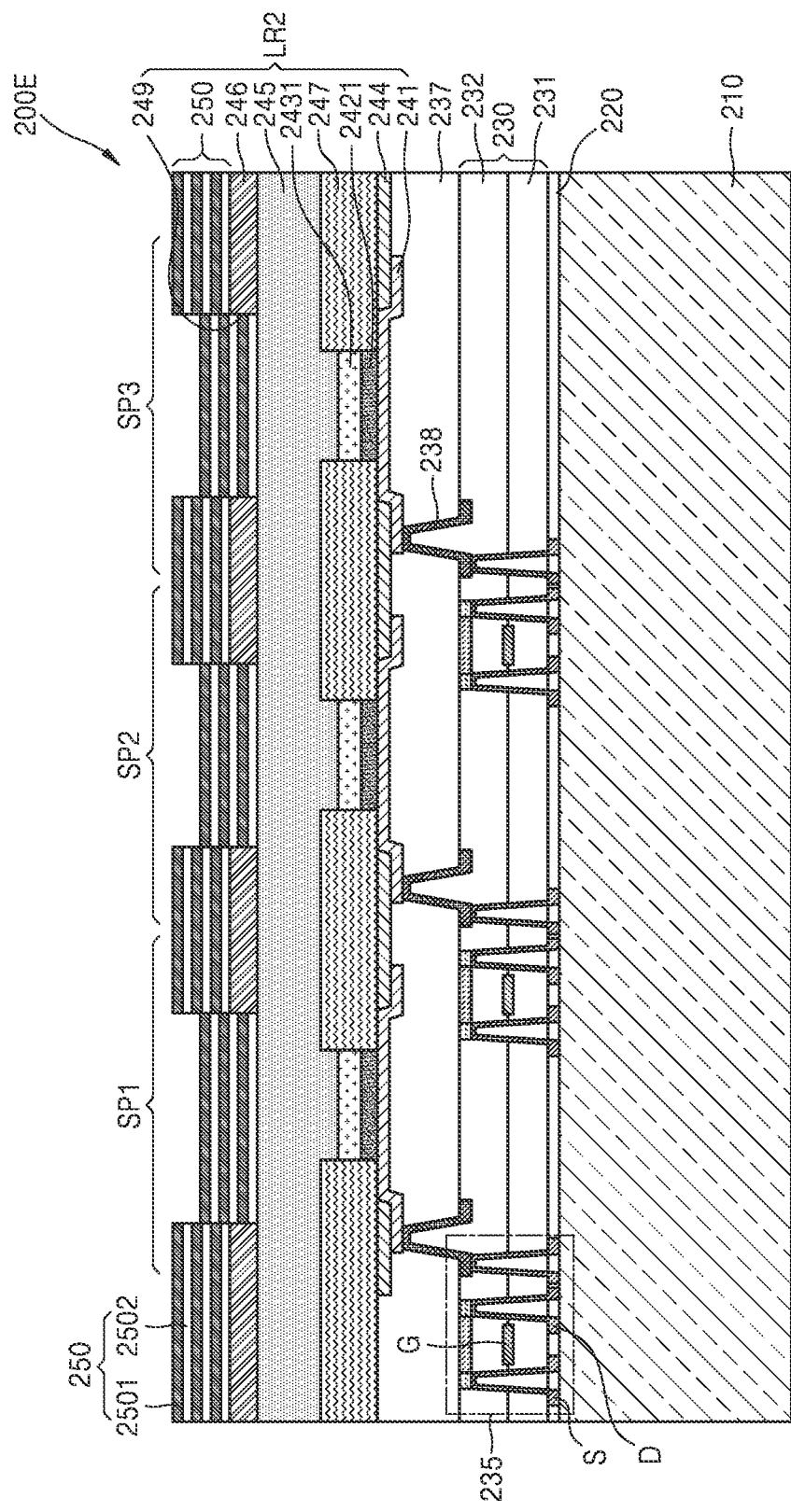
FIG. 7 is a view illustrating an example in which a current spreading layer is removed from the display apparatus shown in FIG. 6.

FIG. 7 is a view illustrating a modification of the display apparatus 200D shown in FIG. 6.

A display apparatus 200E is provided by removing the current spreading layer 260 from the display apparatus 200D shown in FIG. 6. The second electrode 246 having the window regions 249 may be provided on the second semiconductor layer 245, and the reflective layer 250 may be provided on the second electrode 246.

Figure 8:
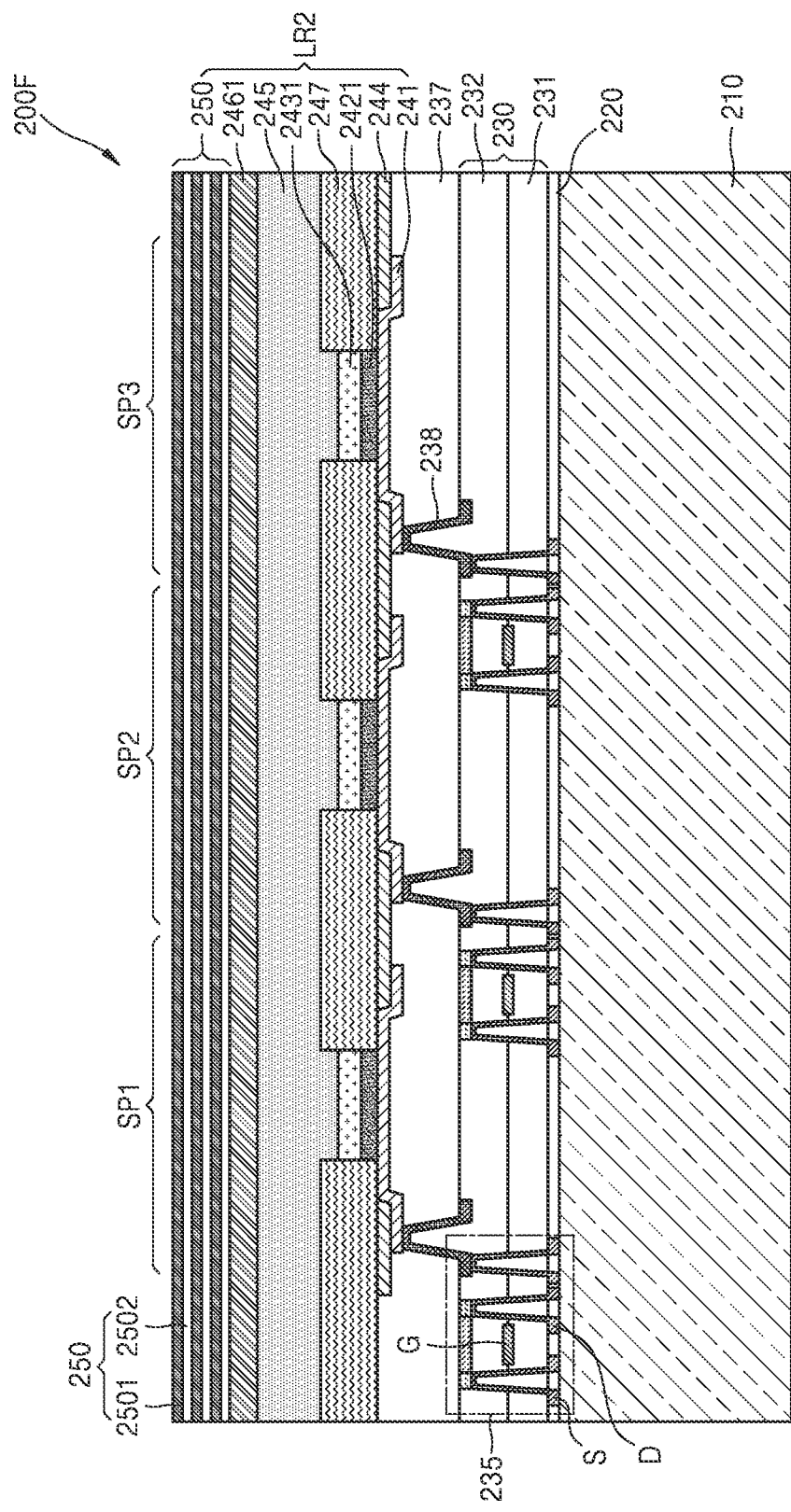
FIG. 8 is a view illustrating a modification example in which a second electrode structure of the display apparatus shown in FIG. 7 is modified.

FIG. 8 is a view illustrating a modification of the display apparatus 200E shown in FIG. 7.

A display apparatus 200F may include a second electrode 2461 having a flat plate shape. The second electrode 2461 may be a transparent electrode. The second electrode 2261 may include, for example, ITO, ZnO, IZO, IGZO, or the like. When the second electrode 2461 is formed as a transparent electrode, the second electrode 2461 may be arranged to cover the entirety of the second semiconductor layer 245. In addition, the reflective layer 250 may be provided on the second electrode 2461. In the example embodiment, the second electrode 2461 may also function as a current spreading layer.

Figure 9:
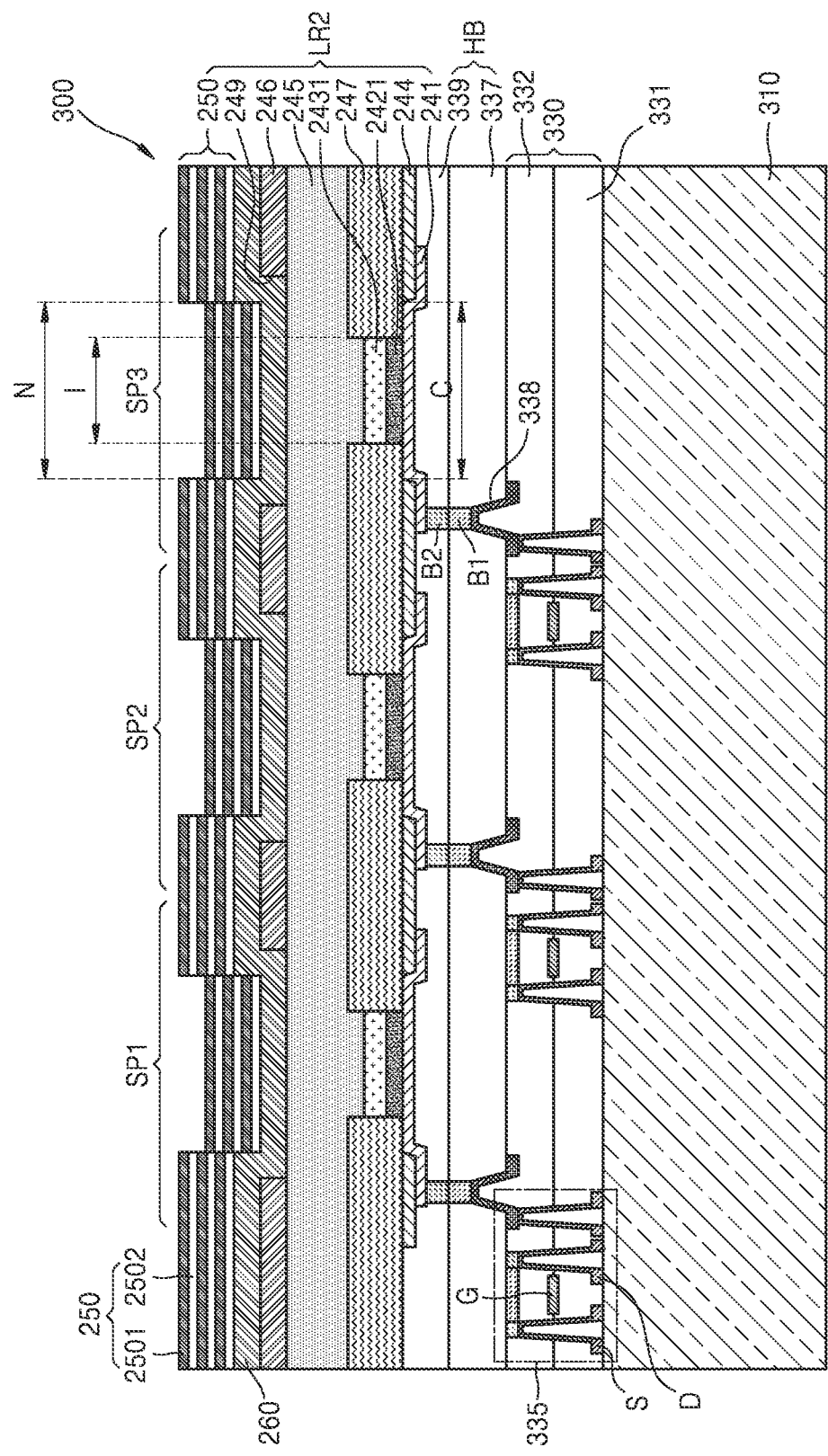
FIG. 9 is a view illustrating a display apparatus according to another example embodiment.

FIG. 9 is a view illustrating a display apparatus 300 according to another example embodiment.

The display apparatus 300 may include a first subpixel SP1, a second subpixel SP2, and a third subpixel SP3. The first subpixel SP1, the second subpixel SP2, and the third subpixel SP3 may emit light having different colors. The display apparatus 300 may include a substrate 310, a driving layer 330 provided on the substrate 310, and a light-emitting resonance layer LR2 provided on the driving layer 330. A coupling layer HB may be provided between the driving layer 330 and the light-emitting resonance layer LR2.

The substrate 310 may include, for example, a glass substrate. However, this is merely an example, and substrates made of various materials may be examples of the substrate 310. For example, the substrate 310 may be a substrate for a CMOS backplane. In this case, the substrate 310 and the driving layer 330 may form a CMOS backplane.

The driving layer 330 may include driving elements 335 for electrically driving the light-emitting resonance layer LR2 on a subpixel basis. The driving elements 335 may include, for example, a transistor, a TFT, or an HEMT. For example, each of the driving elements 335 may include a gate electrode G, a source electrode S, and a drain electrode D. The driving layer 330 may further include at least one insulating layer. For example, the at least one insulating layer may include a first insulating layer 331 and a second insulating layer 332. The second insulating layer 332 may be, for example, a gate oxide.

The coupling layer HB is configured to bond the driving layer 330 and the light-emitting resonance layer LR2 to each other, and may include, for example, a hybrid coupling layer. The coupling layer HB may be formed by a copper (Cu) damascene method. The coupling layer HB may include a third insulating layer 337, first bonding portions B1 provided in the third insulating layer 337, a fourth insulating layer 339, and second bonding portions B2 provided in the fourth insulating layer 339. The first bonding portions B1 and the second bonding portions B2 may include a conductive material. The first bonding portions B1 and the second bonding portions B2 may include, for example, copper (Cu).

The driving layer 330 and the light-emitting resonance layer LR2 may be more easily bonded to each other based on the coupling layer HB. Furthermore, in the example embodiment, the substrate 310 and the driving layer 330 may be more easily manufactured by a CMOS backplane process.

The light-emitting resonance layer LR2 may include a micro light-emitting device array such as a micro LED array, and a resonant structure. The light-emitting resonance layer LR2 may include first electrodes 241, a first semiconductor layer 2421, an active layer 2431, a second semiconductor layer 245, a second electrode 246, and a reflective layer 250. Since the light-emitting resonance layer LR2 has substantially the same structure as that shown in FIG. 6, a detailed description thereof will be omitted. In addition, the light-emitting resonance layer LR2 may be replaced with any one of the light-emitting resonance layers LR2 described with reference to FIGS. 2, 5, 7, and 8.

In addition, via holes 338 may be further provided in the third insulating layer 337 of the coupling layer HB. The via holes 338 may be electrically connected to the driving elements 335. In addition, the first bonding portions B1 may be connected to the via holes 338, and the first bonding portions B1 and the second bonding portions B2 may be connected to each other. The second bonding portions B2 may be connected to the first electrodes 241 of the light-emitting resonance layer LR2. Thus, the driving layer 330 and the light-emitting resonance layer LR2 may be electrically coupled to each other through the first bonding portions B1 and the second bonding portions B2.

In the example embodiment, the display apparatus 300 may be manufactured by more easily bonding the CMOS backplane and the light-emitting resonance layer LR2 to each other.

Figure 10:
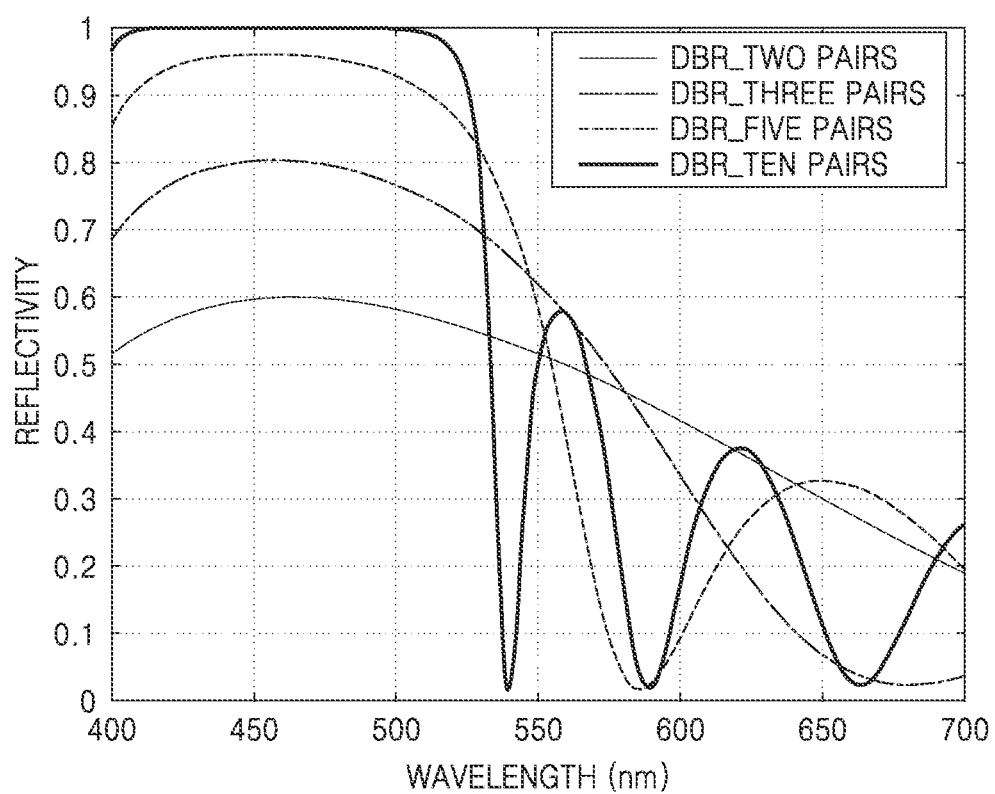
FIG. 10 is a graph illustrating the reflectivity of a reflective layer of the display apparatus shown in FIG. 2 with respect to wavelength.

FIG. 10 is a graph illustrating the reflectivity of the reflective layer 250 of the display apparatus 200 shown in FIG. 2 with respect to wavelength when the reflective layer 250 is formed as a $TiO_2/SiO_2$ distributed Bragg reflector (DBR). In the wavelength band of about 400 nm to about 500 nm, the reflective layer 250 has a reflectivity of about 60% when including two pairs of $TiO_2$ and $SiO_2$ layers, about 80% when including three pairs of $TiO_2$ and $SiO_2$ layers, about 95% when including five pairs of $TiO_2$ and $SiO_2$ layers, and about 100% when including ten pairs of $TiO_2$ and $SiO_2$ layers.

Figure 11:
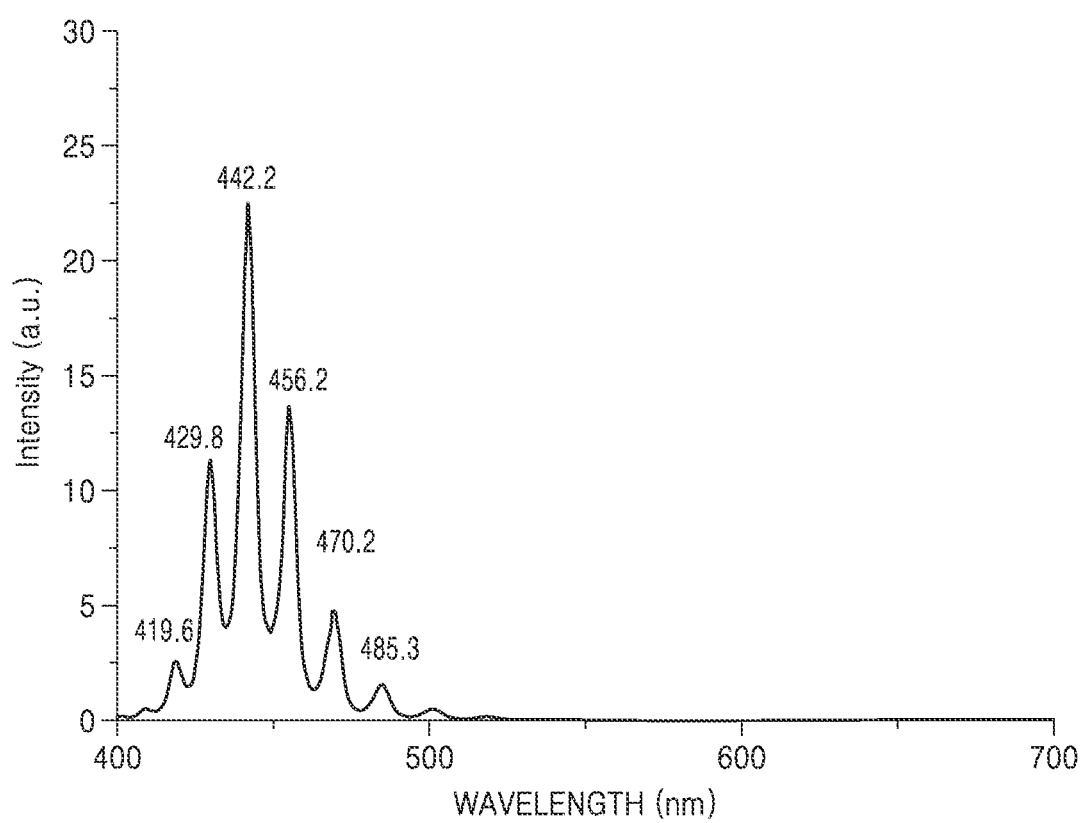
FIG. 11 is a graph illustrating the light intensity of the display apparatus shown in FIG. 2 with respect to wavelength when the display apparatus uses a distributed Bragg reflector having a five-pair stack structure.

FIG. 11 is a graph illustrating the light intensity of a display apparatus with respect to wavelength according to an example embodiment. The display apparatus of the example embodiment has a cavity thickness of about 2.45 μm, and a distributed Bragg reflector in which five pairs of $TiO_2$ and $SiO_2$ layers are stacked. In the graph shown FIG. 11, a multi-resonance mode is shown, and the full width at half maximum is about 4.8 nm. This shows that the full width at half maximum is reduced compared to the full width at half maximum of display apparatuses of the related art which is about 19 nm. Therefore, the beam divergence angle of the display apparatus of the example embodiment may be reduced.

The distributed Bragg reflector may have, for example, two to five pairs of stacked layers. When display apparatuses of example embodiments are required to have a beam divergence angle similar to that of vertical cavity surface emitting lasers (VCSELs), the number of stacked layers of each distributed Bragg reflector may be increased.

Display apparatuses of various example embodiments may be applied to, for example, head-up displays, virtual reality (VR) glasses, augmented reality (AR) glasses, holographic displays, or the like. In addition, display apparatuses of example embodiments may be applied to various other products.

Next, a method of manufacturing a display apparatus will be described according to an example embodiment.

Figure 12:
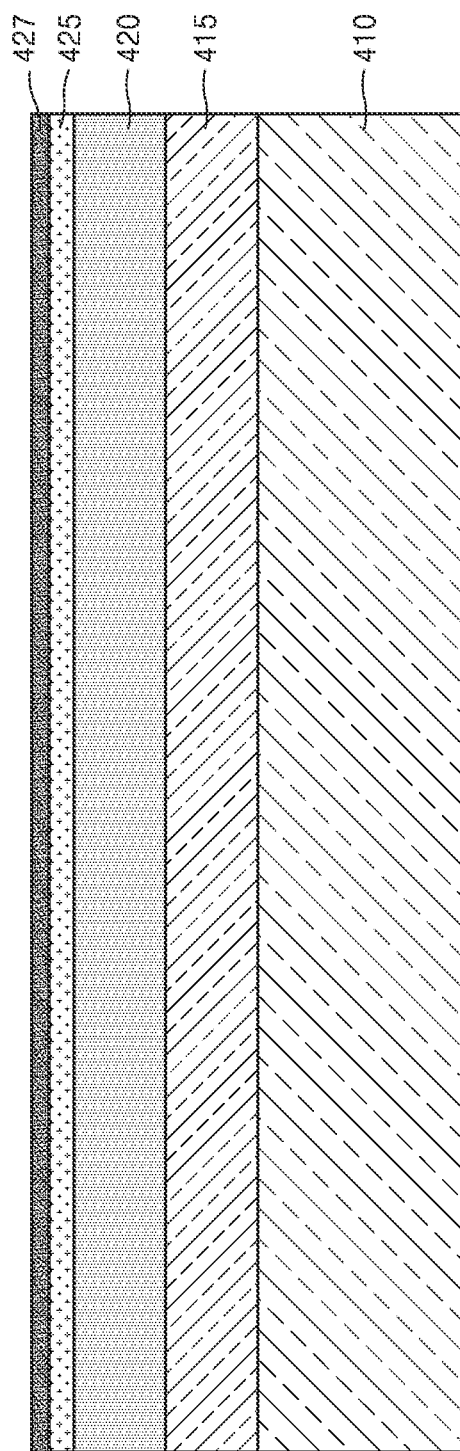
FIGS. 12, 13, 14, 15, 16, 17, 18, 19, 20, 21, 22, and 23 are views illustrating a method of manufacturing a display apparatus according to an example embodiment.

Referring to FIG. 12, a first semiconductor layer 420, a first layer 425, and a second semiconductor layer 427 may be grown on an epitaxial substrate 410. For example, the epitaxial substrate 410 may be a silicon substrate or a sapphire substrate. However, examples of the epitaxial substrate 410 are not limited thereto, and may include various other epitaxial substrates. The first semiconductor layer 420 may include an n-type semiconductor layer. However, in some cases, the first semiconductor layer 420 may include a p-type semiconductor layer. For example, the first semiconductor layer 420 may include n-type GaN. The first layer 425 is a layer for forming an active layer is to be formed, and may include, for example, GaN. A buffer layer 415 may be further formed between the epitaxial substrate 410 and the first semiconductor layer 420. The buffer layer 415 may include a single-layer structure or a multilayer structure, and may facilitate the growth the first semiconductor layer 420. For example, the buffer layer 415 may include AlN. An undoped semiconductor layer such as u-GaN layer may be further provided between the buffer layer 415 and the first semiconductor layer 420.

Figure 13:
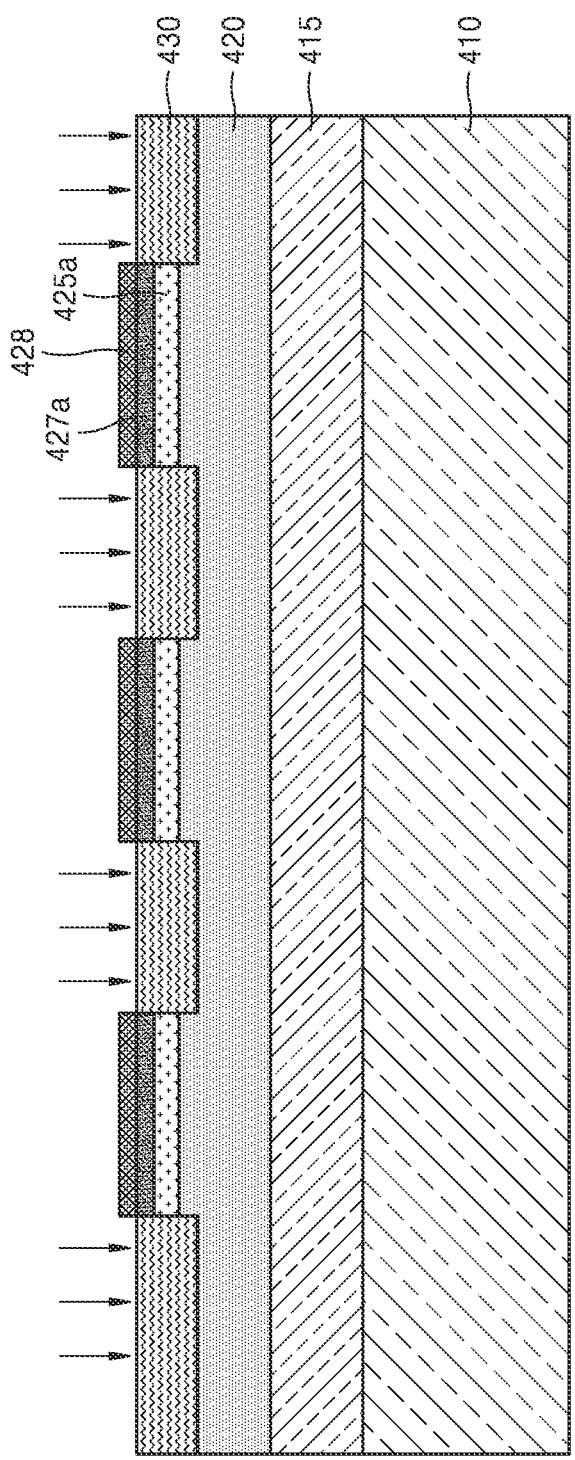

Referring to FIGS. 12 and 13, an isolation structure 430 may be formed in the first layer 425 and the second semiconductor layer 427 by using a mask 428. The mask 428 may be, for example, a mask for ion implantation. For example, the isolation structure 430 may be formed by implanting ions into predetermined regions of the first layer 425 and the second semiconductor layer 427. The ions may include, for example, nitrogen (N) ions, boron (B) ions, argon (Ar) ions, phosphorus (P) ions, or the like. However, the ions are not limited thereto. FIG. 13 illustrates an example in which the isolation structure 430 is formed in the first layer 425 and the second semiconductor layer 427, but the thickness of the isolation structure 430 may be variously determined. For example, the isolation structure 430 may be formed from the second semiconductor layer 427 to a partial depth of the first semiconductor layer 420. An active layer 425a and a second semiconductor layer 427a each having regions separated apart from each other by the isolation structure 430 may be formed. The active layer 425a and the second semiconductor layer 427a each having regions separated apart from each other may define subpixel regions. Based on the isolation structure 430, a micro light-emitting structure array such as a micro LED array may be formed.

As described above, when subpixels are electrically separated from each other by an ion-implanted region, light emission may be induced only inside the active layer 425a by deactivating, by ion implantation, edge portions of the active layer 425a in which defects may be formed. In addition, it is possible to prevent or reduce a decrease in local contrast by electrically separating the pixels (subpixels) by the ion-implanted region. Local contrast may decrease because of unintended emission of light to neighboring pixels (subpixels) at pixel (subpixel) boundaries of a horizontal mesa-free structure in which pixels (subpixels) are not structurally separated from each other. According to the example embodiment, however, contrast may be improved by preventing or reducing spreading of current to adjacent pixels (subpixels) in a mesa-free isolation structure.

Figure 14:
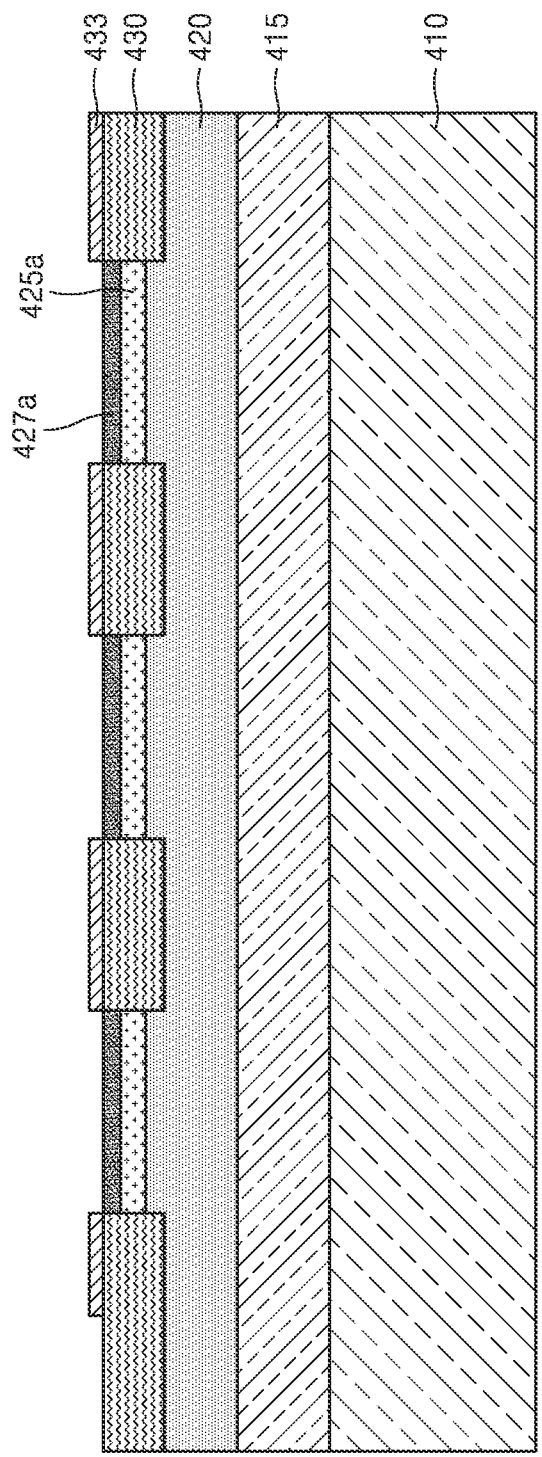

Referring to FIG. 14, a current blocking layer 433 may be deposited on the isolation structure 430. The current blocking layer 433 may be formed through a photoresist etching process. The current blocking layer 433 may include an insulating material. The current blocking layer 433 may electrically insulate first electrodes to be formed later. The current blocking layer 433 may be omitted.

Figure 15:
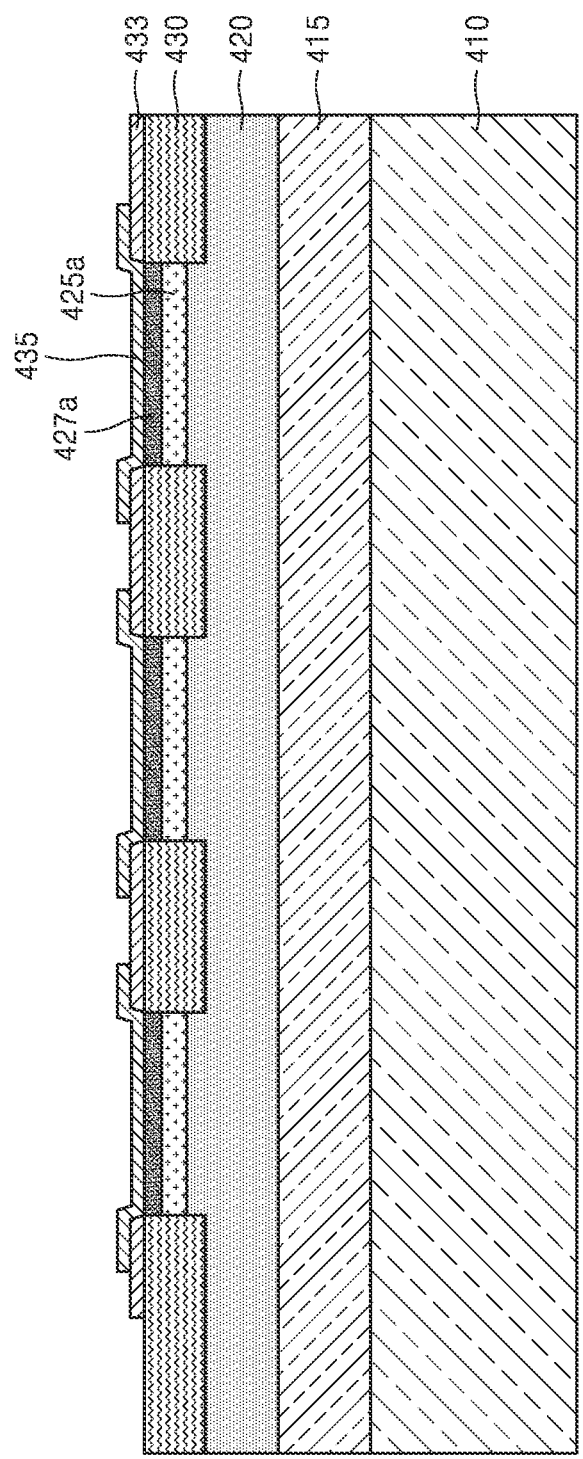

Referring to FIG. 15, a conductive material may be deposited on the structure shown in FIG. 14 and may be etched to form first electrodes 435 separated apart from each other on a subpixel basis. The first electrodes 435 may be pixel electrodes operating on a subpixel basis. The first electrodes 435 may include a reflective conductive material. The first electrodes 435 may include, for example, silver (Ag), gold (Au), aluminum (Al), chromium (Cr), nickel (Ni), or an alloy thereof. The first electrodes 435 may be opaque electrodes.

Figure 16:
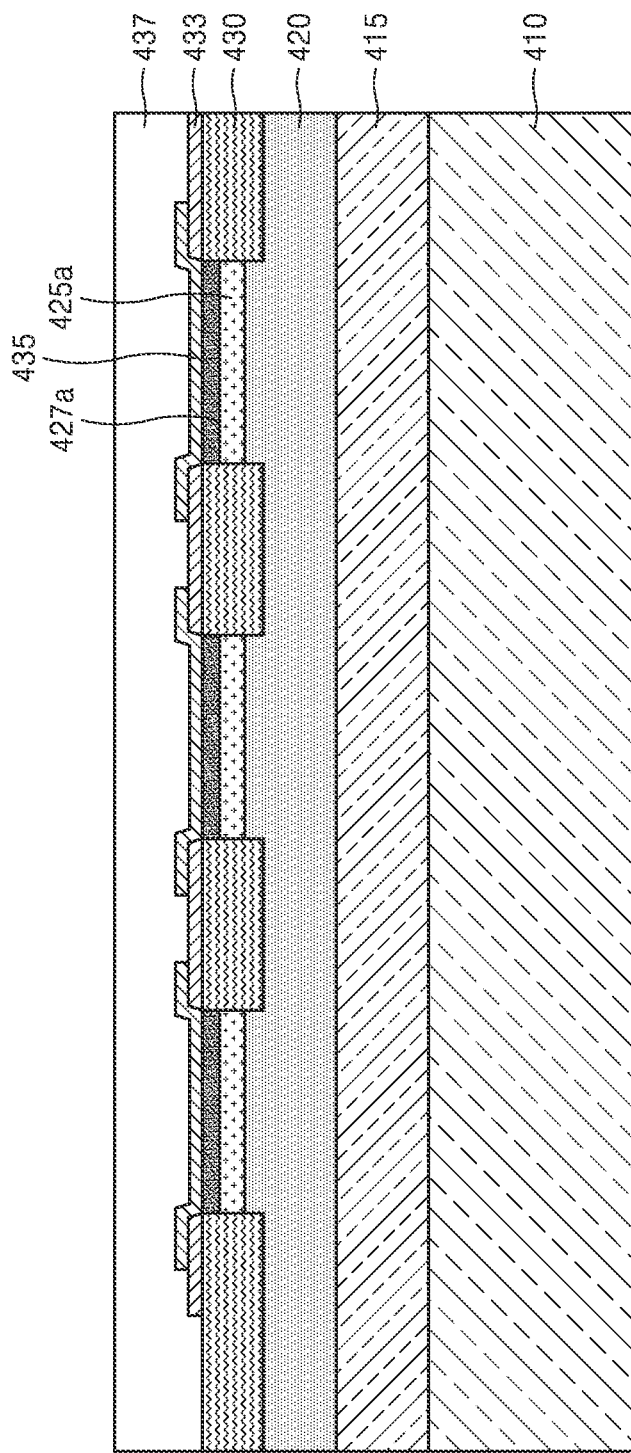

Referring to FIG. 16, a first insulating layer 437 may be formed to cover the first electrodes 435. For example, the first insulating layer 437 may include, but is not limited to, $SiO_2$, SiN, $Al_2O_3$, $TiO_2$, or the like.

Figure 17:
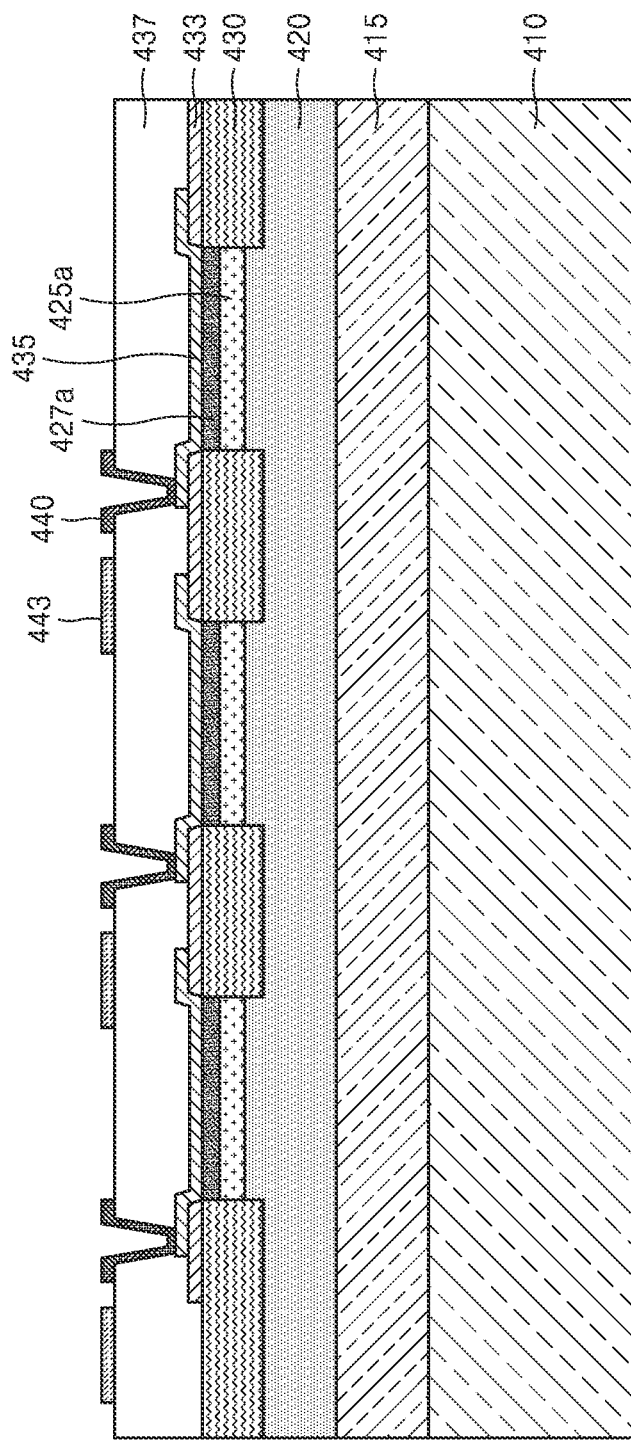

Referring to FIG. 17, the first insulating layer 437 may be etched, and a conductive material may be deposited thereon to form via holes 440 and electrode pads 443. The via holes 440 may be in contact with the first electrodes 435.

Figure 18:
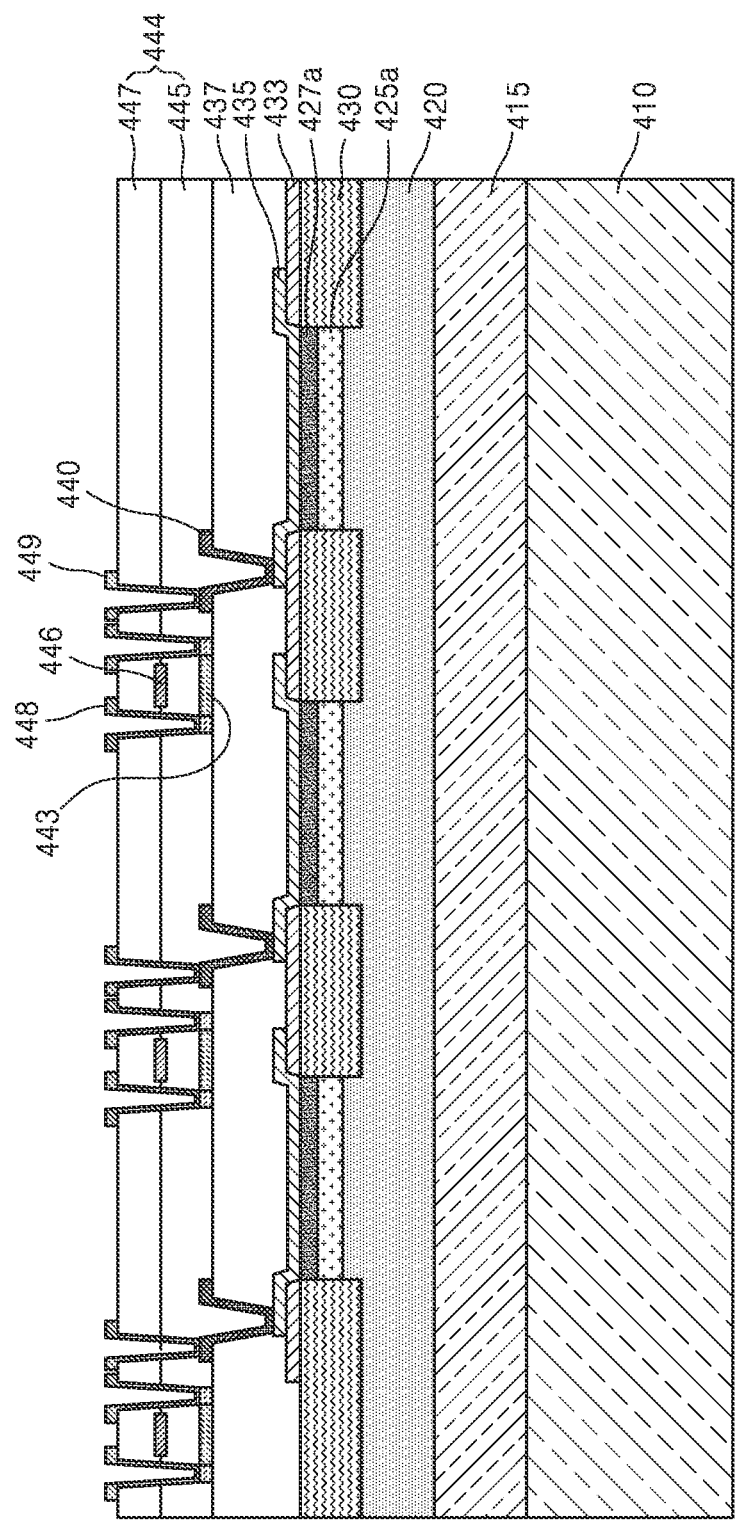

Referring to FIG. 18, a second insulating layer 445 may be formed on the first insulating layer 437, and gate electrodes 446 may be formed on the second insulating layer 445. Thereafter, a third insulating layer 447 may be formed on the second insulating layer 445 and the gate electrodes 446. The second insulating layer 445 and the third insulating layer 447 may be etched to form source electrodes 448 and drain electrodes 449. The gate electrodes 446, the source electrodes 448, and the drain electrodes 449 may form driving elements. Here, a method of forming TFTs as an example of driving elements is described. The source electrodes 448 may be connected to the electrode pads 443, and the drain electrodes 449 may be connected to the via holes 440. As a result, a driving layer may be formed.

Figure 19:
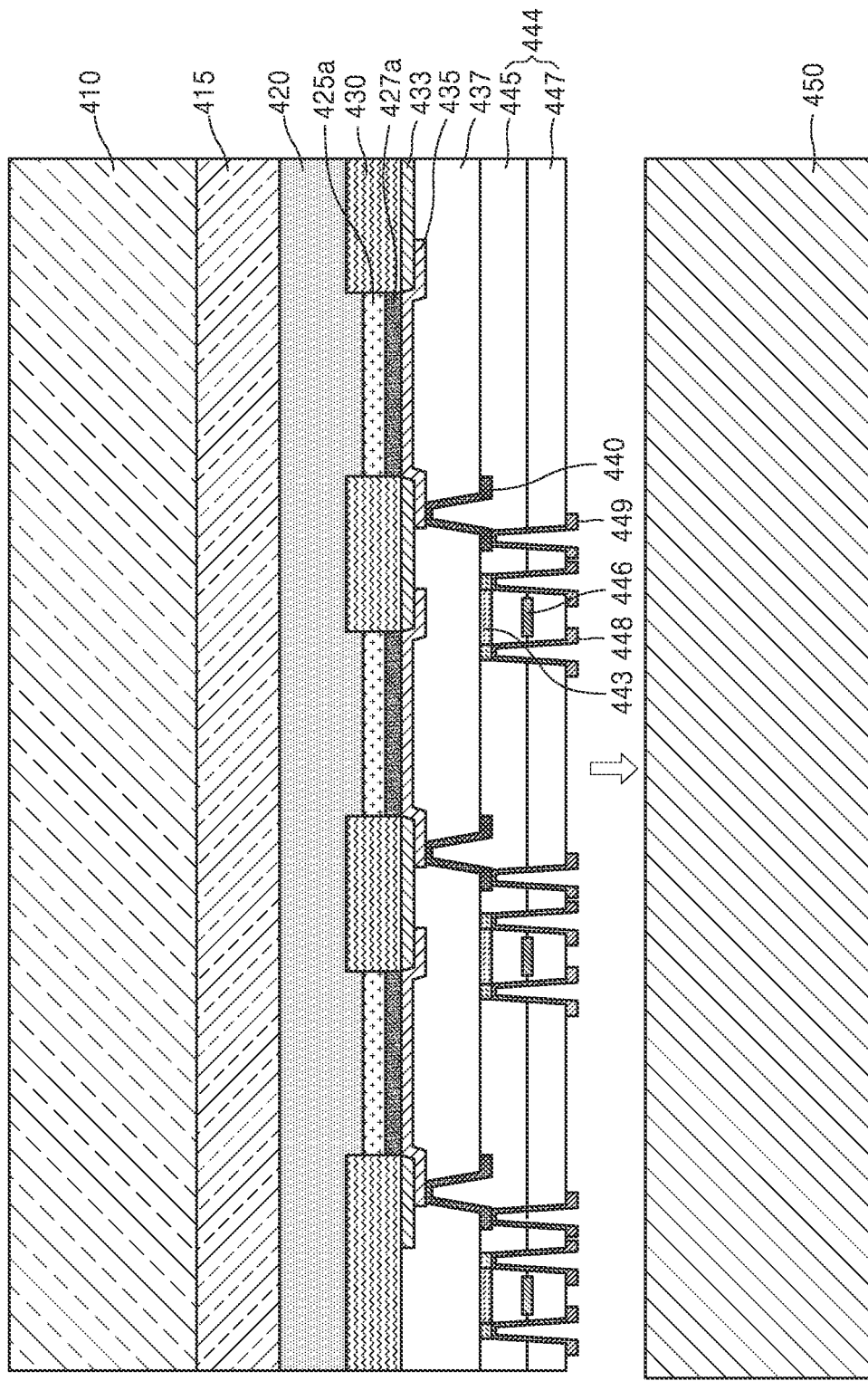
Figure 20:
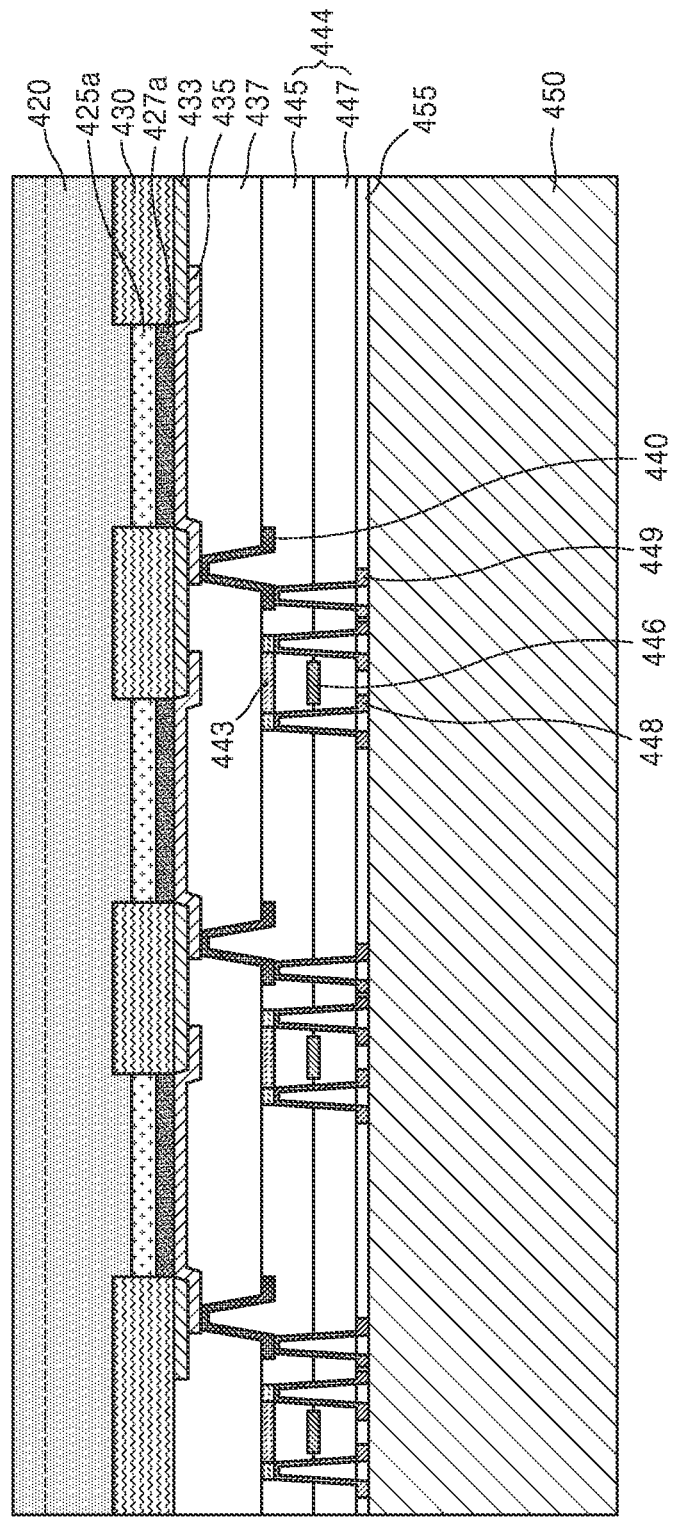

Referring to FIG. 19, the structure illustrated in FIG. 18 may be inverted such that the epitaxial substrate 410 may be upward, and the structure may be arranged such that the third insulating layer 447 may face a substrate 450. The substrate 450 is a substrate for supporting the structure shown in FIG. 18, and for example, the substrate 450 may be a silicon substrate, a glass substrate, a sapphire substrate, or a silicon substrate coated with $SiO_2$. However, these are merely examples, and substrates made of various materials that are more easily bonded to the third insulating layer 447 may be examples of the substrate 450. Referring to FIG. 20, the substrate 450 and the third insulating layer 447 may be bonded to each other using a coupling layer 455. The coupling layer 455 may include, for example, an adhesive layer, a direct coupling layer, or the like. The substrate 450 is for supporting the structure without electrical connection, and the substrate 450 and the structure may be physically coupled to each other by a simple bonding method. For example, the coupling layer 455 may have a thickness of about 0.1 nm to about 10 μm.

After bonding the substrate 450 to the structure, the epitaxial substrate 410 may be removed. For example, the epitaxial substrate 410 may be removed by a laser lift-off method, a polishing method, or the like. The polishing method may be used together with a dry etching method. For example, the epitaxial substrate 410 may be removed by a laser lift-off method when the epitaxial substrate 410 is a sapphire substrate, and a polishing method when the epitaxial substrate 410 is a silicon substrate. For example, the polishing method may use a chemical mechanical polishing (CMP) process.

In addition, the buffer layer 415 may be optionally removed. FIG. 20 illustrates an example in which the buffer layer 415 is removed. The thickness of the first semiconductor layer 420 may be reduced by etching or polishing.

For example, the first semiconductor layer 420 may have a thickness of about 0.5 μm to about 3.0 μm.

Figure 21:
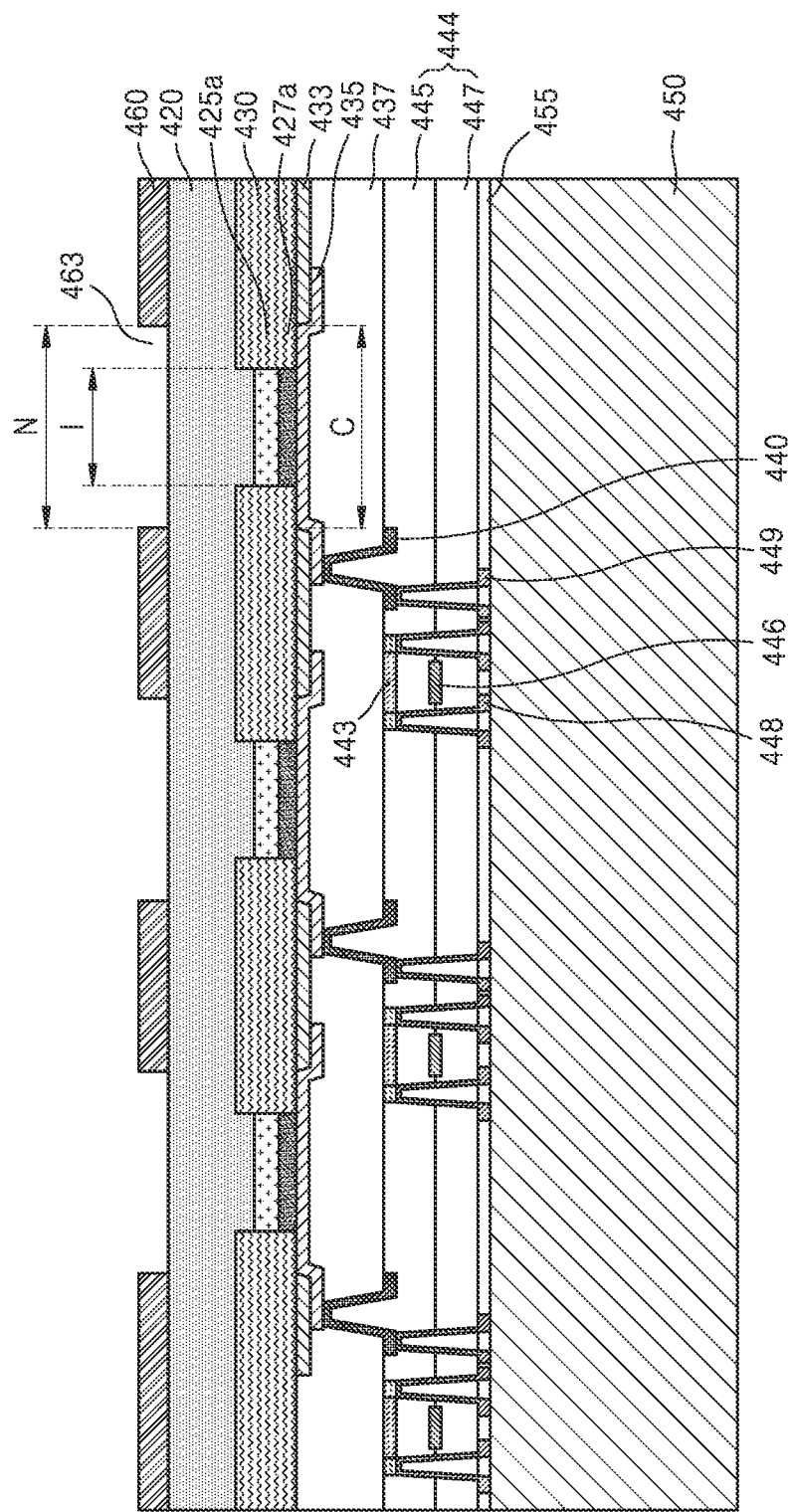

Referring to FIG. 21, a second electrode 460 may be formed on the first semiconductor layer 420 through an etching process. The second electrode 460 may be formed as an opaque electrode. When the second electrode 460 is an opaque electrode, window regions 463 may be formed in the second electrode 460 by etching the second electrode 460 to allow transmission of light. Here, the active layer 425a may have a width I less than or equal to the width N of the window regions 463. The width I of the active layer 425a may be less than or equal to the spacing C of the current blocking layer 433.

Figure 22:
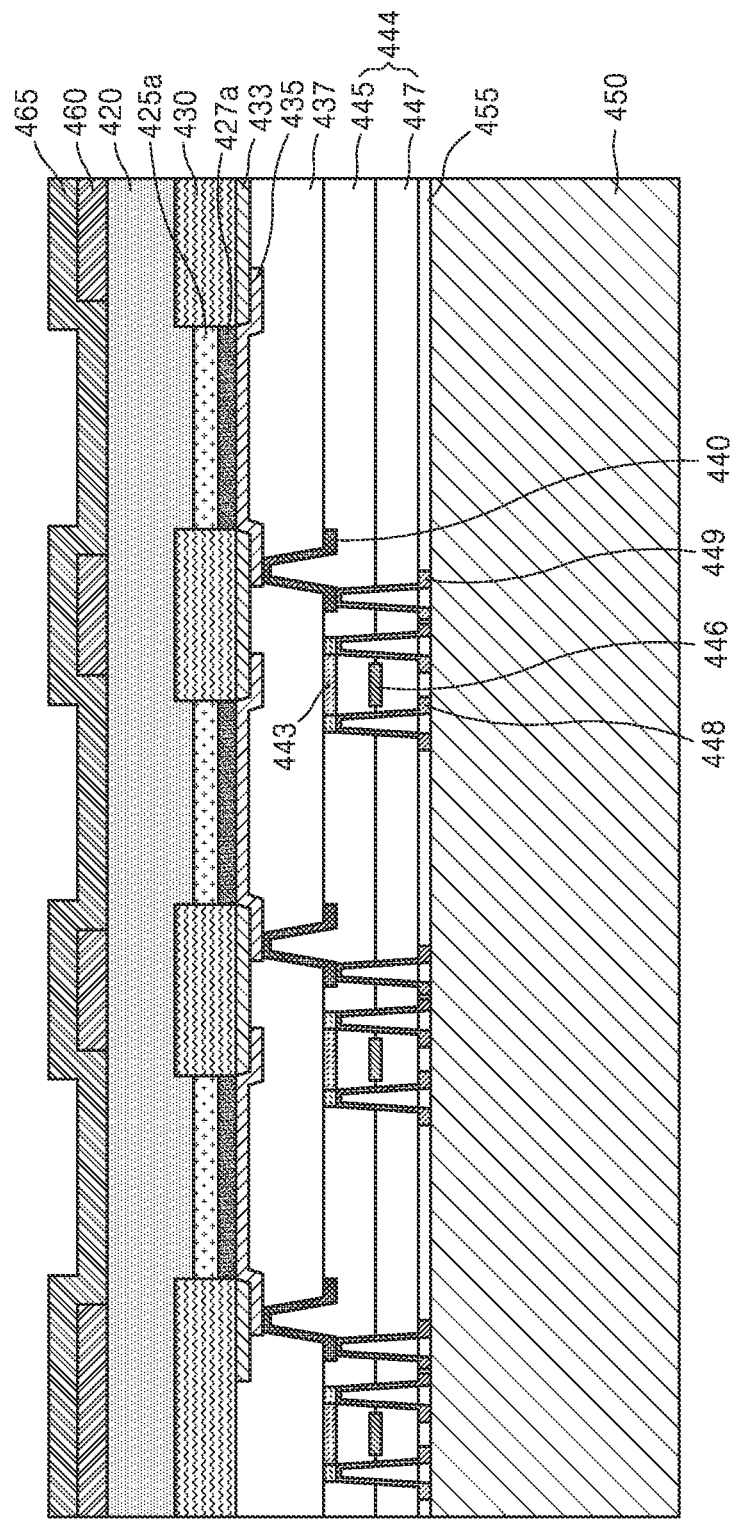

Referring to FIG. 22, a current spreading layer 465 may be formed on the second electrode 460. The current spreading layer 465 may include a transparent material. The current spreading layer 465 may include, for example, ITO.

Figure 23:
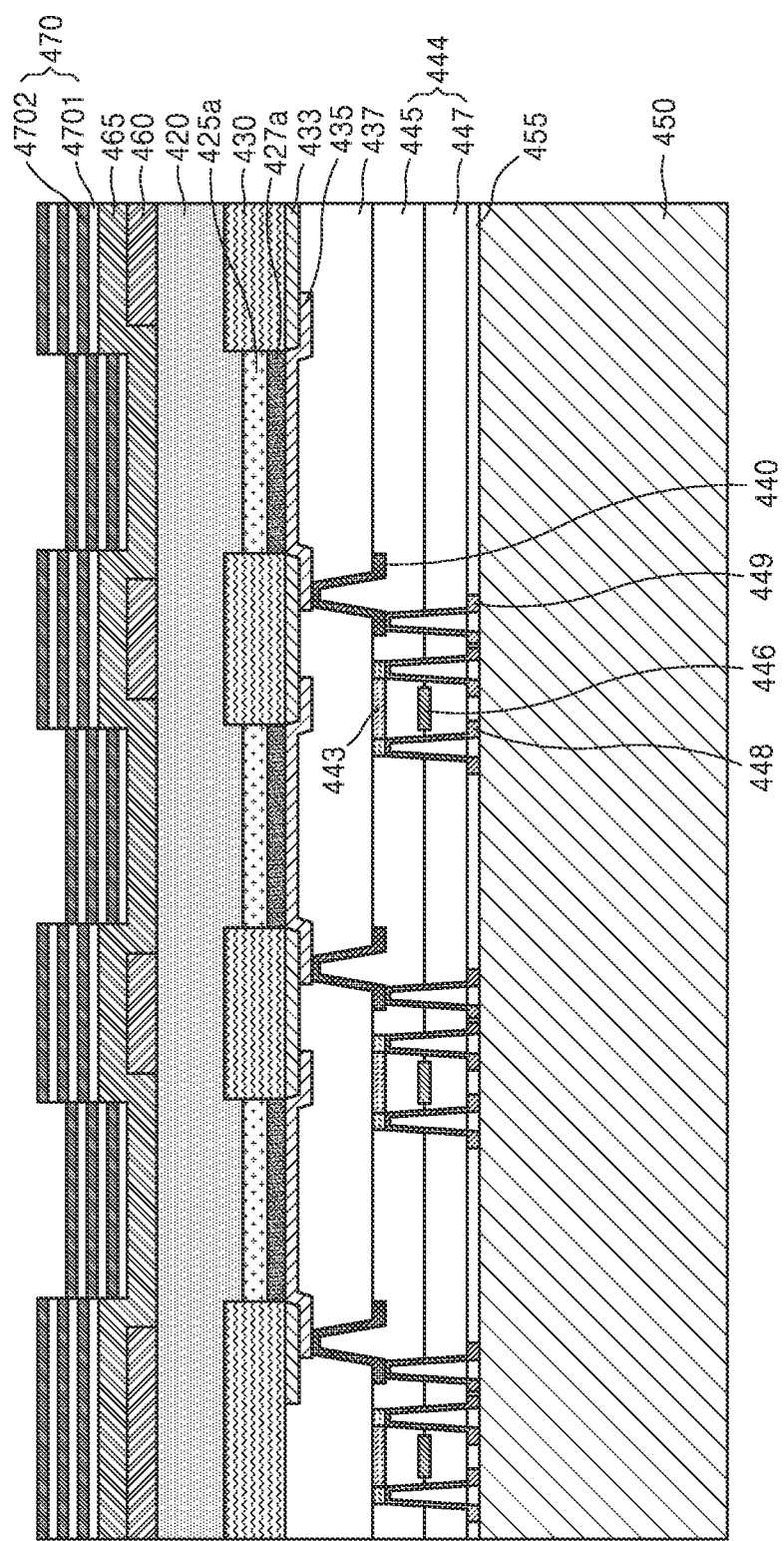

Referring to FIG. 23, a reflective layer 470 may be formed on the current spreading layer 465. For example, the reflective layer 470 may be formed as a distributed Bragg reflector. The reflective layer 470 may be formed by alternately stacking a plurality of pairs of third layers 4701 having a first refractive index and fourth layers 4702 having a second refractive index.

In this manner, a display apparatus may be manufactured according to the example embodiment. According to the manufacturing of the example embodiment, the driving layer and the light-emitting resonance layer of the display apparatus may be monolithically formed. In addition, according to the display apparatus manufacturing method of the example embodiment, a vertical electrode structure having no mesa structure may be formed through a flipping process in which the epitaxial substrate 410 is inverted to face upward. In addition, manufacturing processes may be simplified because a via hole etching process for forming electrodes is simplified, and a decrease in internal quantum efficiency that may be caused by a mesa structure may be prevented because no mesa structure is formed. In addition, the divergence angle of a beam may be reduced by inducing resonance between the first electrodes 435 and the reflective layer 470.

Figure 24:
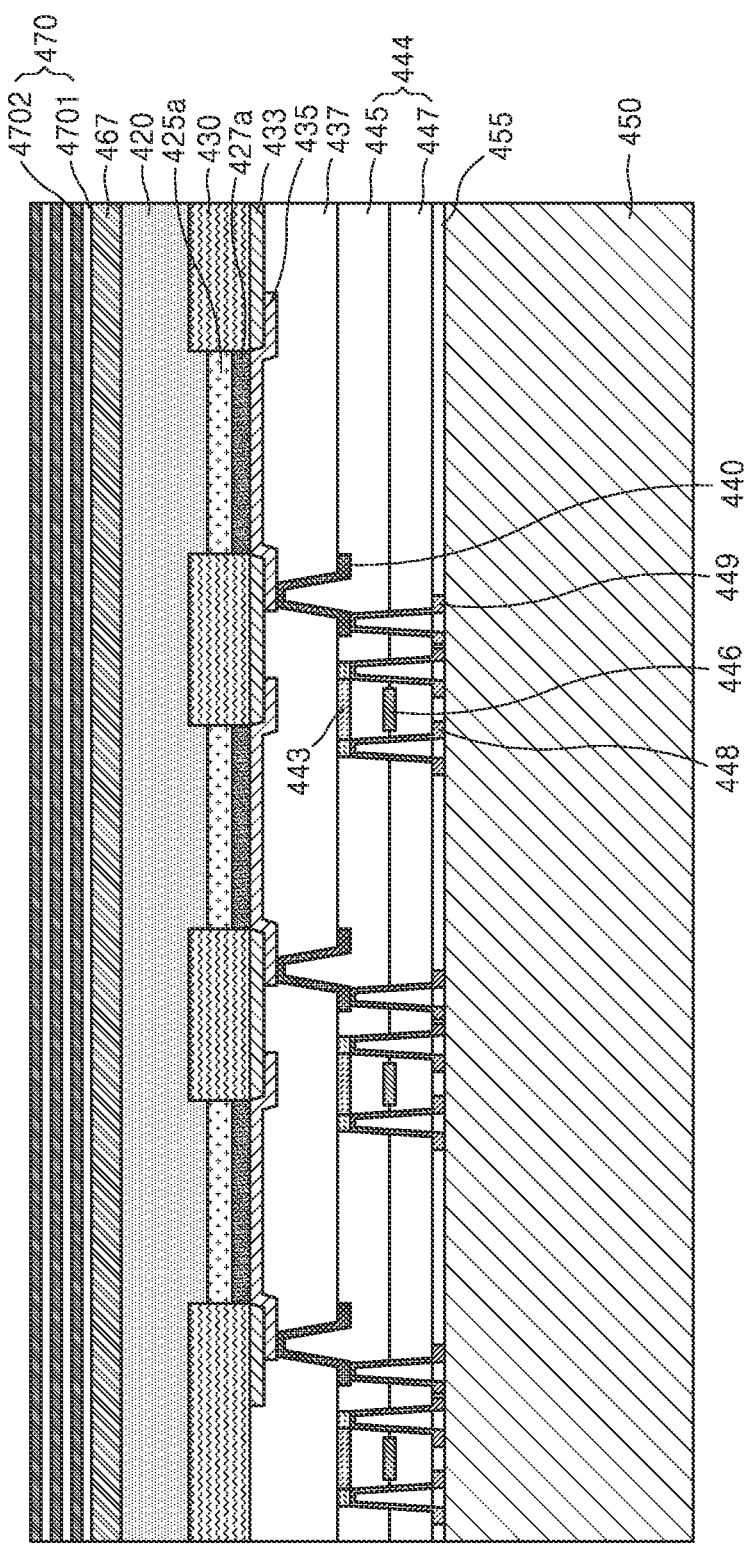
FIGS. 24, 25, and 26 are views illustrating methods of manufacturing display apparatuses according to other example embodiments.

FIG. 24 is a view illustrating an example in which a second electrode 467 is formed as a transparent electrode unlike in FIG. 21. The second electrode 467 may include, for example, ITO, ZnO, IZO, IGZO, or the like. When the second electrode 467 is a transparent electrode, the second electrode 467 may be arranged to cover the entirety of a first semiconductor layer 420. The transparent electrode does not need window regions because light pass through the transparent electrode. Then, a reflective layer 470 may be deposited on the second electrode 467.

The second electrode 467 may be a common electrode, and since the second electrode 467 has a simple structure, the second electrode 467 may be simply manufactured with fewer errors. In addition, a driving layer including TFTs is arranged under an active layer 425a, and the second electrode 467, which is a common electrode, is arranged above the active layer 425a, such that regions through which light is output may be more easily guaranteed. In addition, first electrodes 435 are arranged below the active layer 425a such that light emitted downward from the active layer 425a may be reflected upward by the first electrodes 435, and thus the light may be repeatedly reflected between the reflective layer 470 and the first electrodes 435, thereby inducing resonance, improving light emission efficiency, and reducing the divergence angle of a beam.

Figure 25:
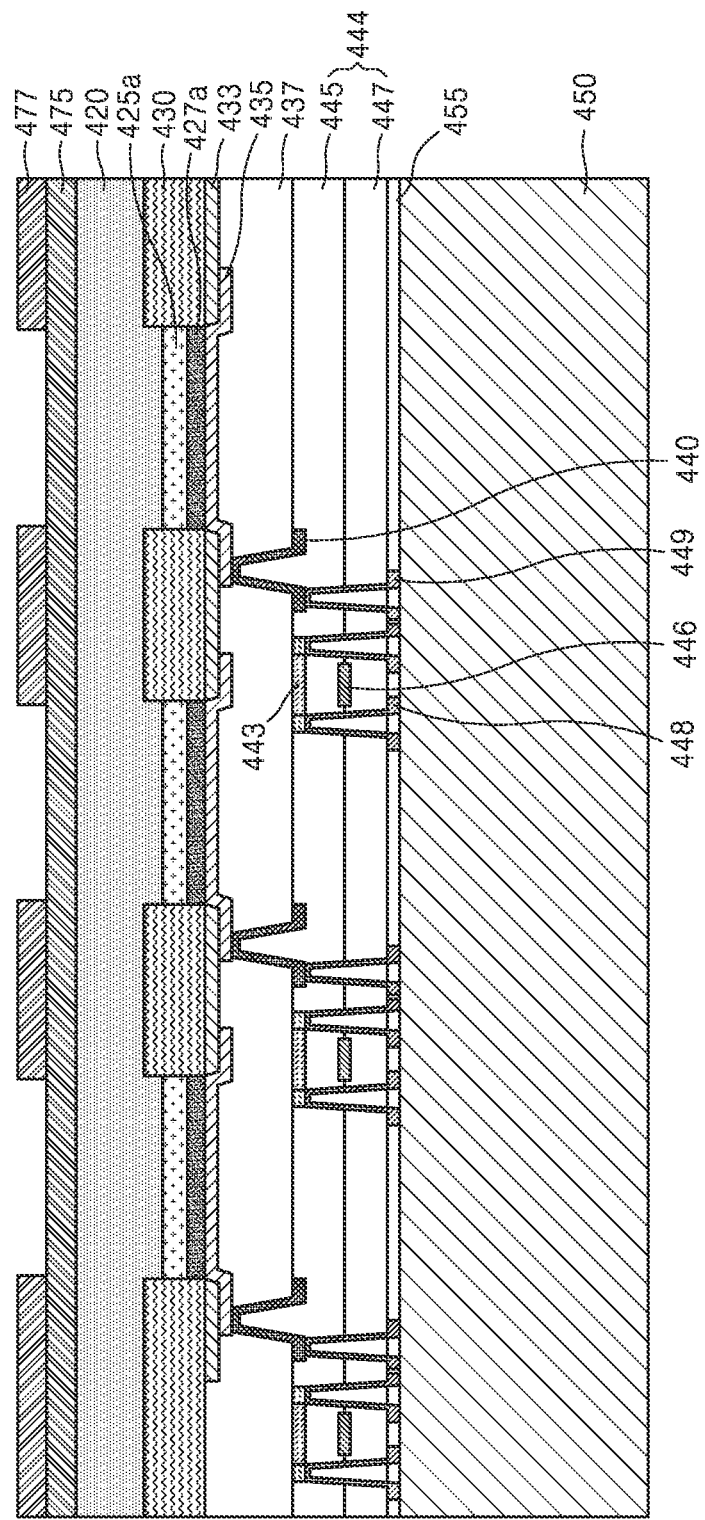
Figure 26:
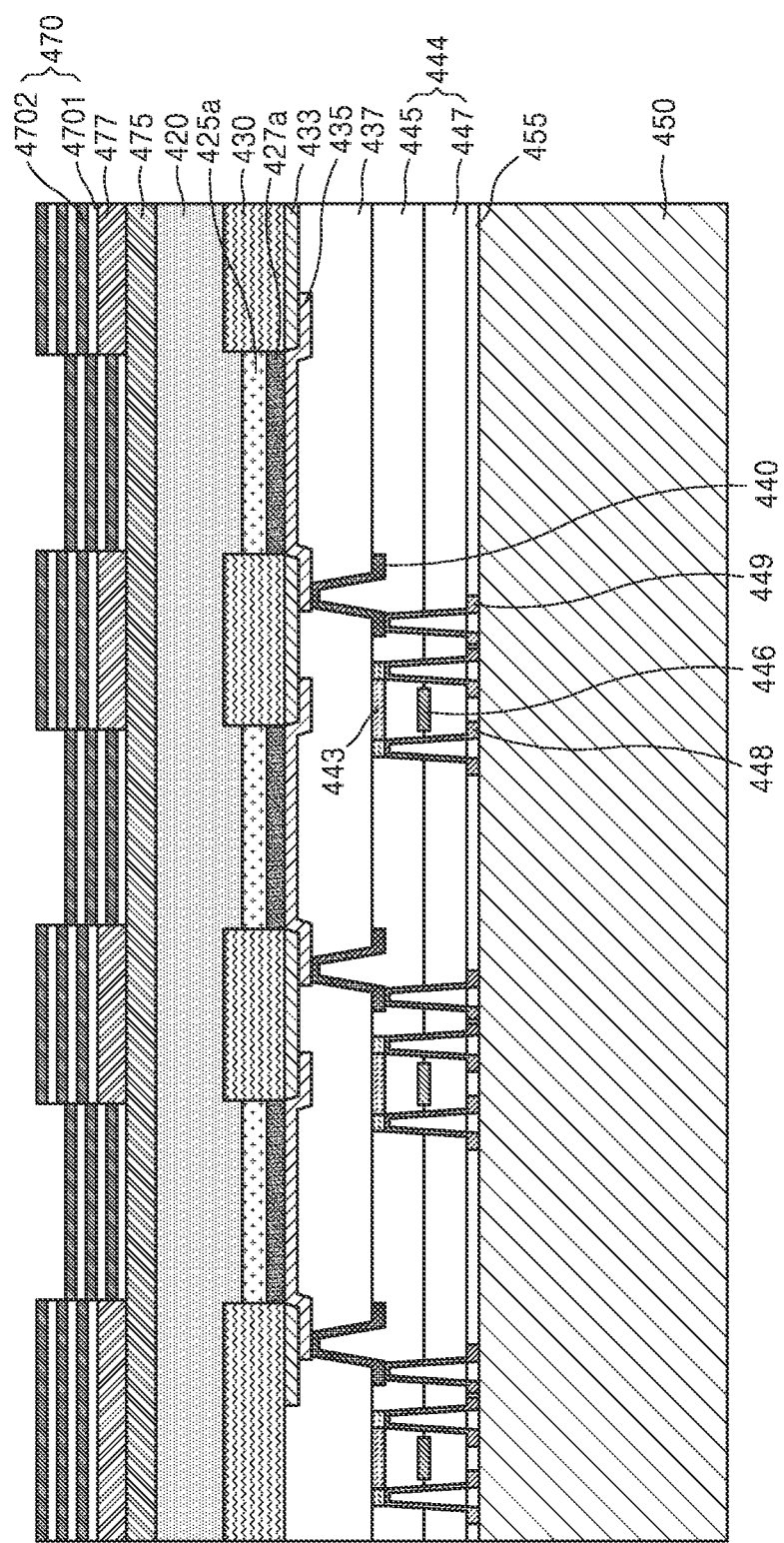

Next, FIGS. 25 and 26 are views illustrating a method of manufacturing a display apparatus according to another example embodiment. Referring to FIG. 25, a current spreading layer 475 may be formed on the first semiconductor layer 420 of the structure shown in FIG. 20. In addition, a second electrode 477 may be formed by depositing and etching a layer on the current spreading layer 475. Referring to FIG. 26, a reflective layer 470 may be formed on the second electrode 477.

Figure 27:
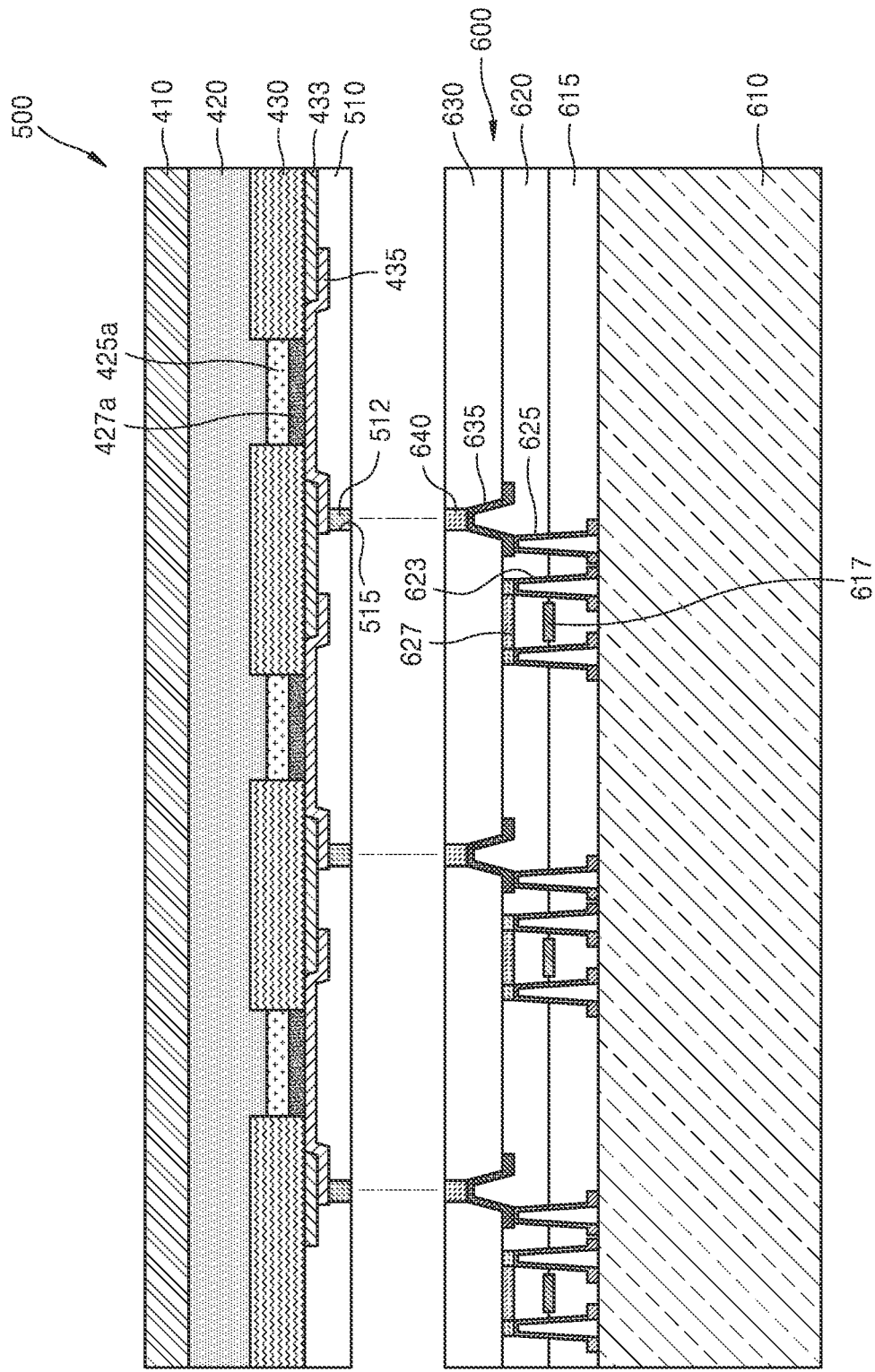
FIGS. 27, 28, and 29 are views illustrating methods of manufacturing display apparatuses according to other example embodiments.
Figure 28:
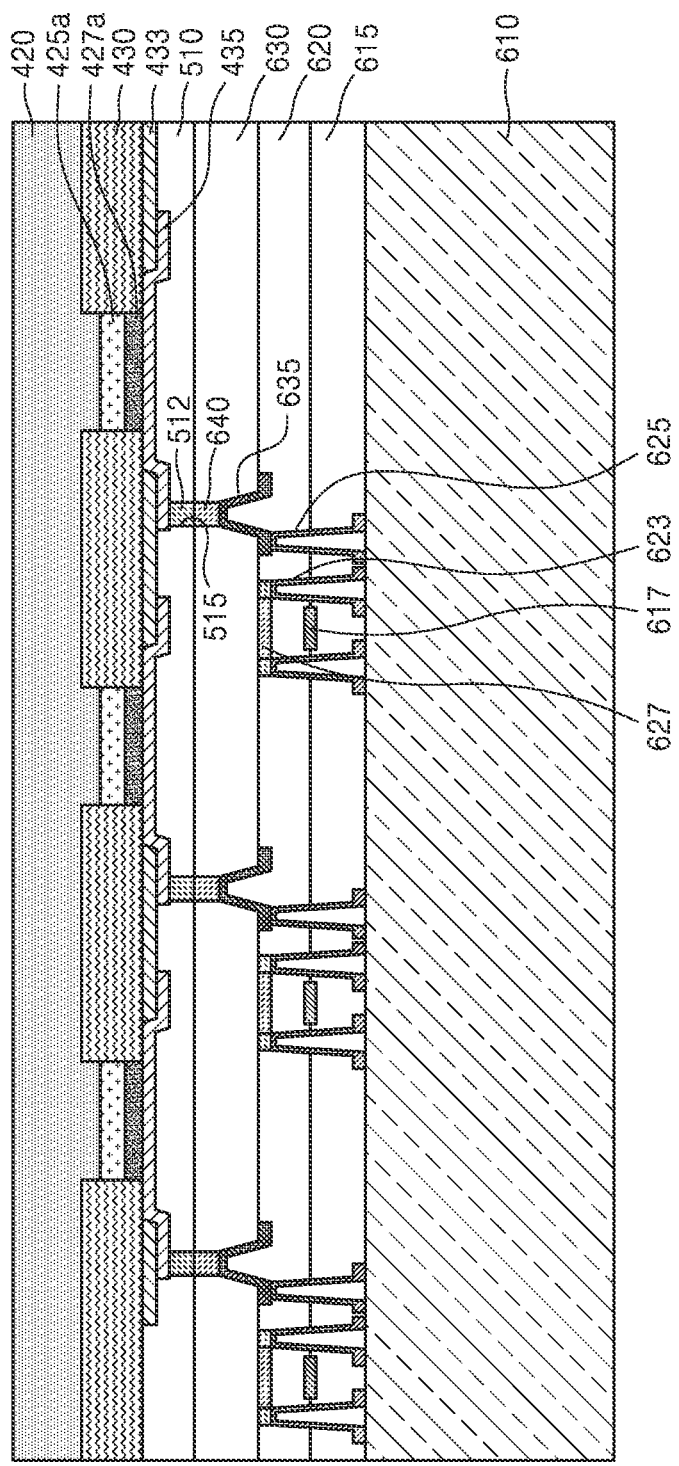
Figure 29:
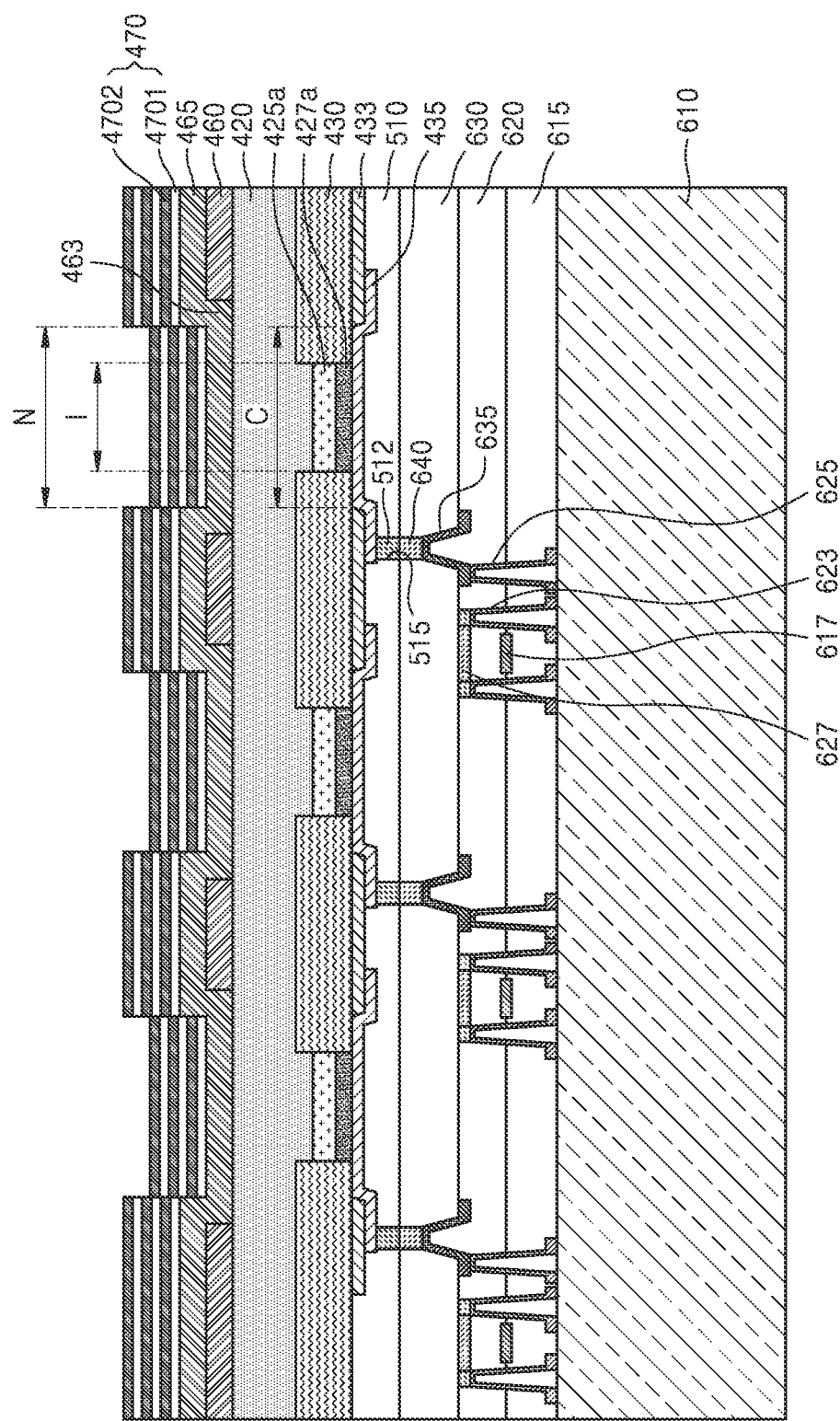

FIGS. 27 to 29 are views illustrating a method of manufacturing a display apparatus according to another embodiment.

Referring to FIG. 27, a micro LED array 500 may be formed, and a CMOS backplane 600 may be formed. Thereafter, the micro LED array 500 and the CMOS backplane 600 may be bonded together. The micro LED array 500 may be manufactured according to the method described with reference to FIGS. 12 to 15. Therefore, the manufacturing method of the example embodiment will be described with the structure shown in FIG. 15. However, the structure shown in FIG. 27 does not include the buffer layer 415 shown in FIG. 15. In FIG. 27, the micro LED array 500 is prepared by inverting the structure shorn in FIG. 15. A first insulating layer 510 may be formed on the first electrodes 435 of the structure shown in FIG. 15. First bonding portions 512 are formed in the first insulating layer 510. The first bonding portions 512 may include a conductive material. For example, the first bonding portions 512 may include copper (Cu). A damascene process may be used to form the first bonding portions 512 in the first insulating layer 510.

The first bonding portions 512 may be formed by etching the first insulating layer 510 through a photolithography process to form holes 515, and filling copper (Cu) in the holes 515 by an electro-chemical plating technique. In addition, the first bonding portions 512 may be planarized by removing protruding portions of the first bonding portions 512 through a CMP process.

The manufacturing process of CMOS backplane 600 is well known. A second insulating layer 615 is formed on a substrate 610, and gate electrodes 617 are formed on the second insulating layer 615 through photolithography and etching processes. A third insulating layer 620 is deposited on the second insulating layer 615. Source electrodes 623, drain electrodes 625, and electrode pads 627 are formed in the third insulating layer 620 through etching and deposition processes.

Next, a fourth insulating layer 630 is formed on the third insulating layer 620. Via holes 635 are formed in the fourth insulating layer 630. Thereafter, second bonding portions 640 may be formed in the fourth insulating layer 630 such that the second bonding portions 640 may be connected to the via holes 635. The second bonding portions 640 may include a conductive material. For example, the second bonding portions 640 may include copper (Cu). The second bonding portions 640 may be formed in the fourth insulating layer 630 by the above-described damascene process.

As described above, the micro LED array 500 and the CMOS backplane 600 may be formed, and as illustrated in FIG. 28, the micro LED array 500 and the CMOS backplane 600 may be bonded together. The micro LED array 500 and the CMOS backplane 600 may be bonded together through a hybrid bonding process. Then, the epitaxial substrate 410 may be removed.

Referring to FIG. 29, a second electrode 460 may be formed on the first semiconductor layer 420 through an etching process. The second electrode 460 may be formed as an opaque electrode. When the second electrode 460 is an opaque electrode, window regions 463 may be formed in the second electrode 460 by etching the second electrode 460 to allow transmission of light.

A current spreading layer 465 may be formed on the second electrode 460. The current spreading layer 465 may include a transparent material. The current spreading layer 465 may include, for example, ITO. A reflective layer 470 may be formed on the current spreading layer 465. For example, the reflective layer 470 may be formed as a distributed Bragg reflector. The reflective layer 470 may be formed by alternately stacking a plurality of pairs of third layers 4701 having a first refractive index and fourth layers 4702 having a second refractive index.

Here, the active layer may have a width I less than or equal to the width N of the window regions 463. The width I of the active layer 425a may be less than or equal to the spacing C of the current blocking layer 433.

As described above, according to the methods of material display apparatuses of the example embodiments, display apparatuses may be easily manufactured through a micro LED array process, a CMOS backplane process, and a damascene process.

In addition, high-resolution display apparatuses may be manufactured by the manufacturing methods of the example embodiments. Although the size of pixels is reduced to increase the resolution of the display apparatuses, the beam divergence angle of the display apparatuses may be reduced by inducing resonance in a light-emitting resonance structure, thereby reducing crosstalk and increasing color purity.

As described above, according to the one or more of the above example embodiments, the display apparatuses are configured to reduce the divergence angle of a beam, and thus even when the pixel size of the display apparatuses is reduced for high resolution, light may not spread between neighboring pixels, thereby reducing crosstalk between neighboring pixels and increasing color purity.

In addition, example embodiments provide methods of manufacturing display apparatuses in which a light-emitting structure and a resonant structure are coupled to each other.

It should be understood that embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
   forming a first semiconductor layer on an epitaxial substrate;
   forming an active layer on the first semiconductor layer;
   forming a second semiconductor layer on the active layer;
   isolating the active layer based on each of a plurality of subpixels;
   forming a first electrode on the second semiconductor layer based on each of the plurality of subpixels;
   forming a driving layer which comprises a driving element electrically connected to the first electrode;
   removing the epitaxial substrate;
   forming a second electrode on the first semiconductor layer; and
   forming a reflective layer on the second electrode opposite to the first semiconductor layer,
   wherein the reflective layer comprises a distributed Bragg reflector, and
   wherein the first semiconductor layer is provided to cover the plurality of subpixels in common and comprises a planar surface through the plurality of subpixels.

2. The method of claim 1, wherein the isolating of the active layer based on each of the plurality of subpixels comprises forming an ion-implanted region.

3. The method of claim 1, wherein the first electrode comprises a reflective material configured to reflect light.

4. The method of claim 1, further comprising bonding the driving layer to a second substrate by a fusion bonding method or a direct bonding method.

5. The method of claim 4, wherein the second substrate and the driving layer are formed through a complementary metal-oxide semiconductor (CMOS) backplane manufacturing process, and the driving layer and the first electrode are coupled to each other by a copper damascene method.

6. The method of claim 1, wherein the second electrode is transparent and covers the first semiconductor layer.

7. The method of claim 1, wherein the second electrode is opaque, and a window region is formed in the second electrode to transmit light emitted from the active layer.

8. The method of claim 7, wherein a width of the active layer is less than a width of the window region.

9. The method of claim 1, further comprising forming a plurality of color conversion layers based on each of a plurality of subpixels, the plurality of color conversion layers being configured to convert light emitted from the active layer into light having different colors.

10. The method of claim 1, wherein the first electrode faces the active layer.

11. The method of claim 1, further comprising forming a current spreading layer between the first semiconductor layer and the reflective layer and between the reflective layer and the second electrode.

12. The method of claim 1, further comprising forming a current spreading layer between the first semiconductor layer and the reflective layer and between the first semiconductor layer and the second electrode.

* * * * *